United States Patent
Kumakura et al.

(10) Patent No.: US 11,961,746 B2
(45) Date of Patent: *Apr. 16, 2024

(54) SUBSTRATE PROCESSING METHOD AND SUBSTRATE PROCESSING APPARATUS

(71) Applicant: Tokyo Electron Limited, Tokyo (JP)

(72) Inventors: Sho Kumakura, Miyagi (JP); Hironari Sasagawa, Miyagi (JP); Maju Tomura, Miyagi (JP); Yoshihide Kihara, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/887,061

(22) Filed: Aug. 12, 2022

(65) Prior Publication Data

US 2022/0399212 A1 Dec. 15, 2022

Related U.S. Application Data

(63) Continuation of application No. 16/804,807, filed on Feb. 28, 2020, now Pat. No. 11,450,537.

(30) Foreign Application Priority Data

| Feb. 28, 2019 | (JP) | 2019-036708 |
| Nov. 11, 2019 | (JP) | 2019-203918 |
| Feb. 17, 2020 | (JP) | 2020-024686 |

(51) Int. Cl.
| H01L 21/67 | (2006.01) |
| C23C 16/02 | (2006.01) |
| C23C 16/46 | (2006.01) |
| C23C 16/50 | (2006.01) |
| H01L 21/027 | (2006.01) |

(Continued)

(52) U.S. Cl.
CPC .... *H01L 21/67069* (2013.01); *C23C 16/0227* (2013.01); *C23C 16/46* (2013.01); *C23C 16/50* (2013.01); *H01L 21/0271* (2013.01); *H01L 21/0337* (2013.01); *H01L 21/30655* (2013.01); *H01L 21/31116* (2013.01);

(Continued)

(58) Field of Classification Search
None
See application file for complete search history.

(56) References Cited

U.S. PATENT DOCUMENTS

| 2007/0116872 A1 | 5/2007 | Li et al. |
| 2008/0242097 A1 | 10/2008 | Boescke et al. |

(Continued)

FOREIGN PATENT DOCUMENTS

| JP | H03-267372 A | 11/1991 |
| JP | 2006-222208 A | 8/2006 |

(Continued)

*Primary Examiner* — Stephanie P Duclair
(74) *Attorney, Agent, or Firm* — XSENSUS LLP

(57) ABSTRACT

A substrate processing method includes (a) forming a recess on a workpiece by partially etching the workpiece; and (b) forming a film having a thickness that differs along a depth direction of the recess, on a side wall of the recess. Step (b) includes (b-1) supplying a first reactant, and causing the first reactant to be adsorbed to the side wall of the recess; and (b-2) supplying a second reactant, and causing the second reactant to react with the first reactant thereby forming a film.

20 Claims, 22 Drawing Sheets

(51) Int. Cl.
  *H01L 21/033* (2006.01)
  *H01L 21/3065* (2006.01)
  *H01L 21/311* (2006.01)
  *H01L 21/32* (2006.01)

(52) U.S. Cl.
  CPC .. *H01L 21/31122* (2013.01); *H01L 21/31144* (2013.01); *H01L 21/67207* (2013.01); *H01L 21/32* (2013.01)

(56) References Cited

U.S. PATENT DOCUMENTS

| | | |
|---|---|---|
| 2010/0105208 A1 | 4/2010 | Winniczek et al. |
| 2010/0173494 A1 | 7/2010 | Kobrin |
| 2016/0163558 A1* | 6/2016 | Hudson ................ H10B 43/27 156/345.24 |
| 2016/0343580 A1 | 11/2016 | Hudson |
| 2017/0178920 A1 | 6/2017 | Dole et al. |
| 2018/0174858 A1 | 6/2018 | Hudson |

FOREIGN PATENT DOCUMENTS

| | | |
|---|---|---|
| JP | 2017-041628 A | 2/2017 |
| JP | 2018-046216 A | 3/2018 |
| WO | 2017/217132 A1 | 12/2017 |
| WO | 2019/027811 A1 | 2/2019 |

* cited by examiner

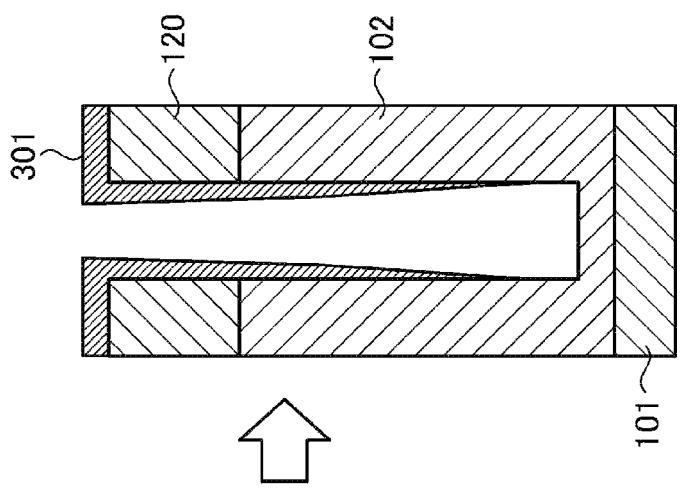

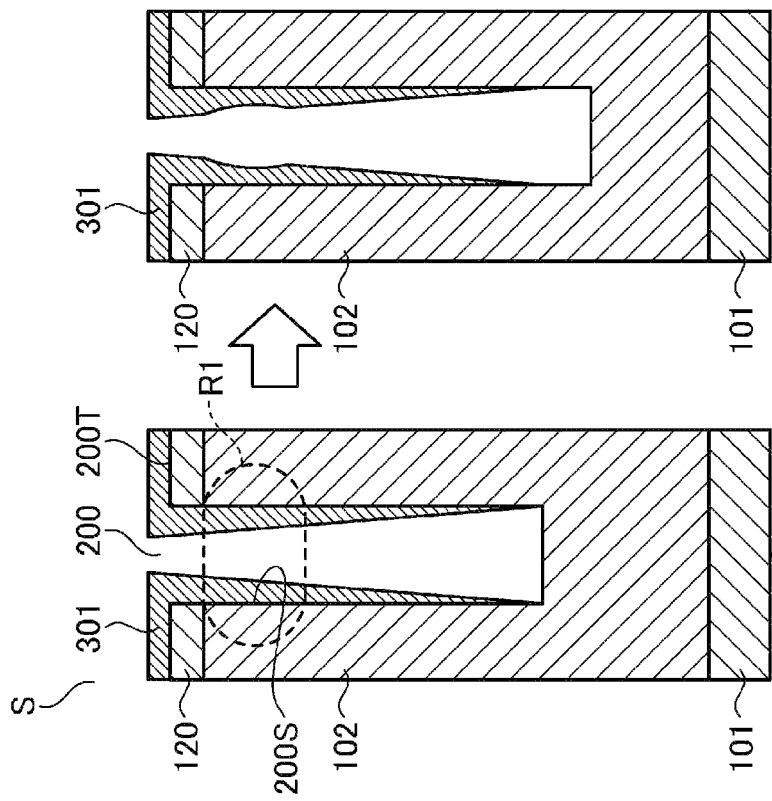

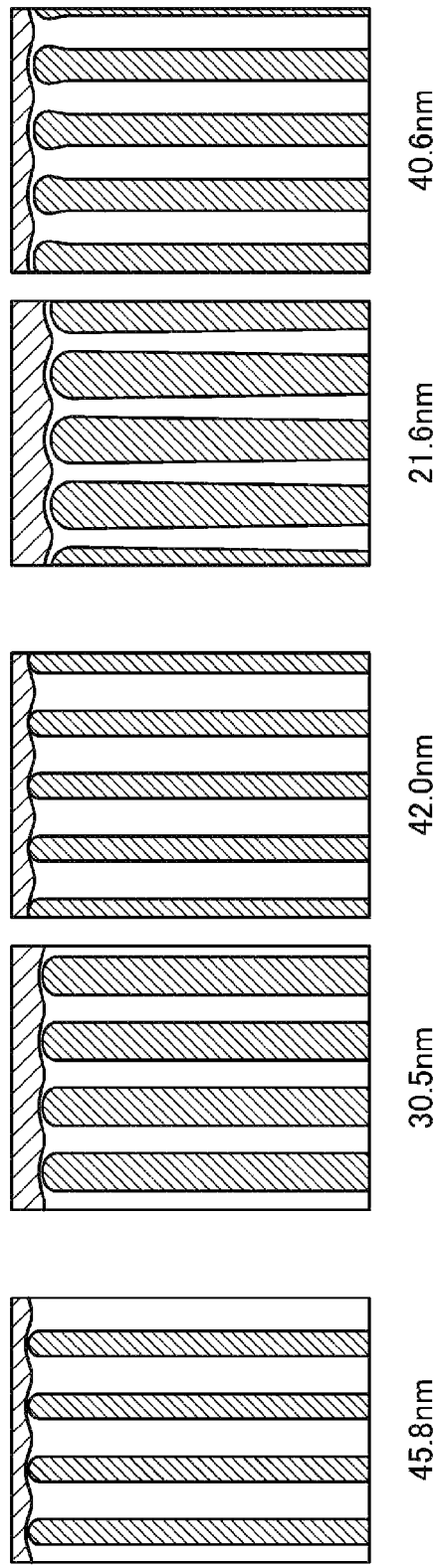

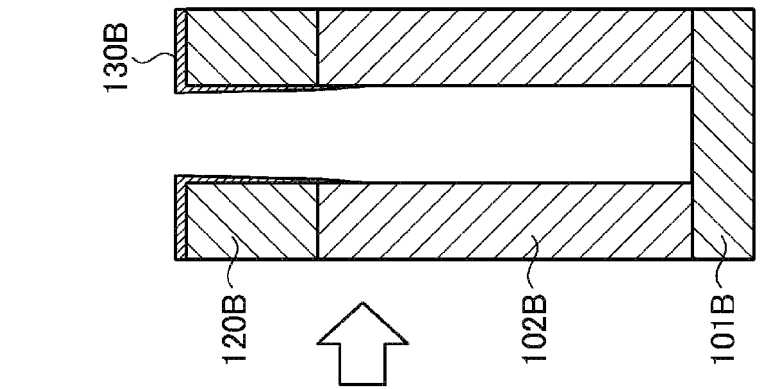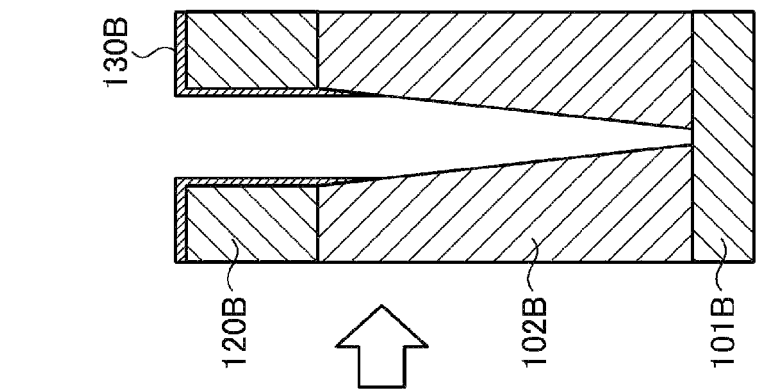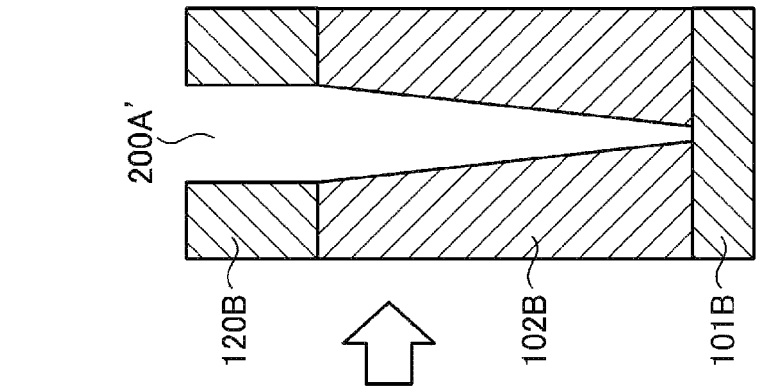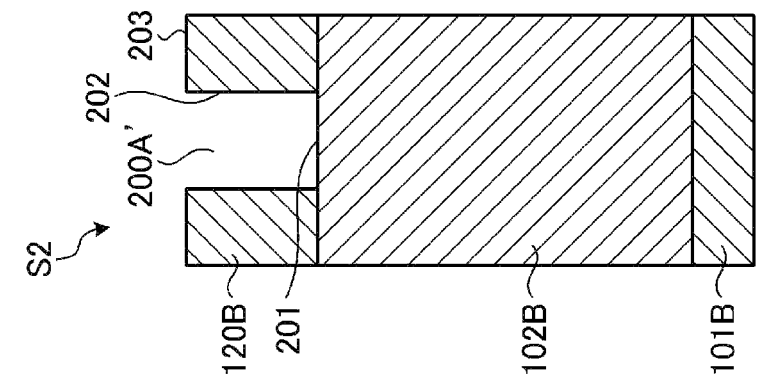

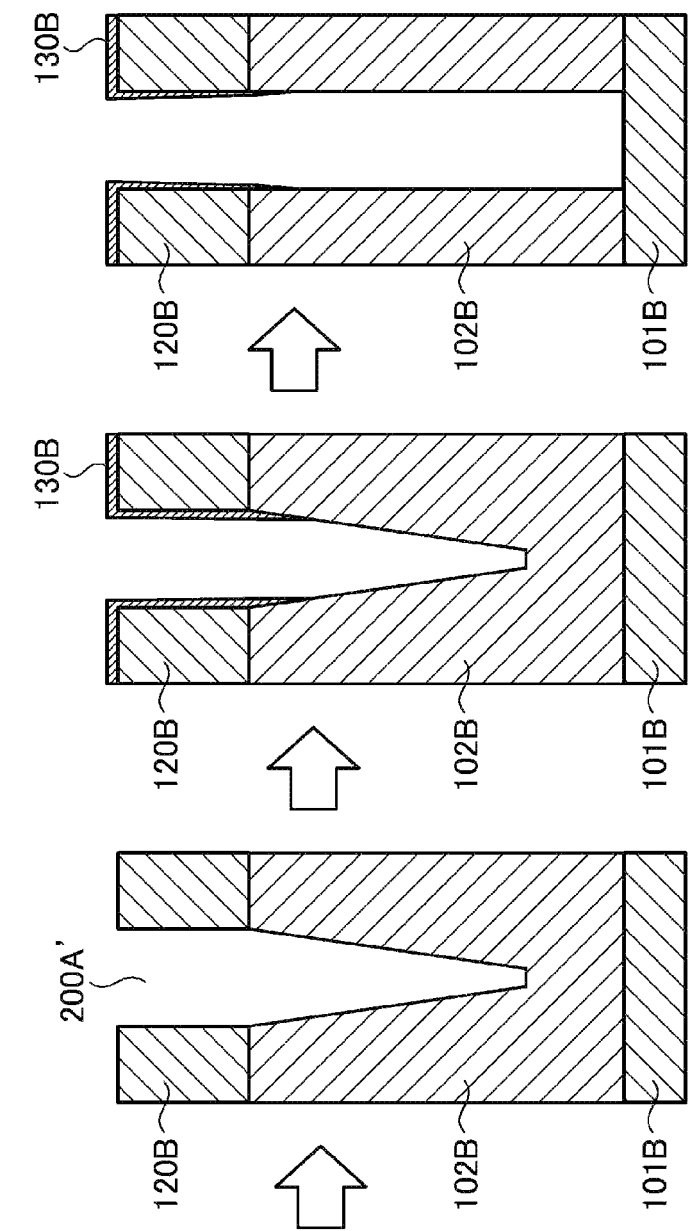

*FIG. 21A* *FIG. 21B*
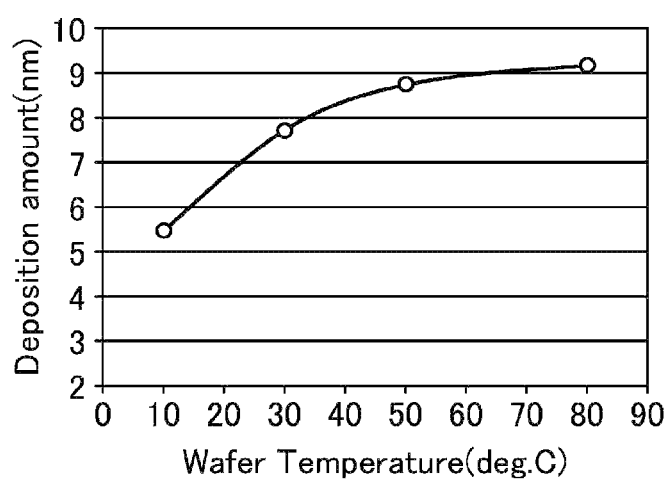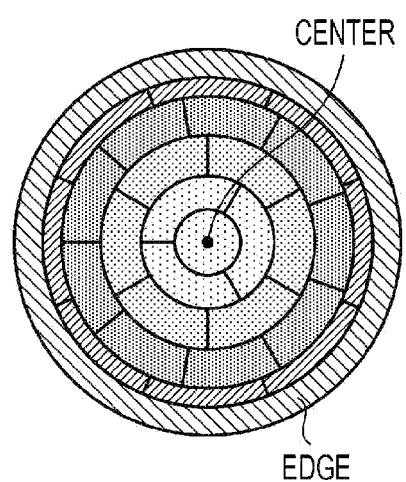

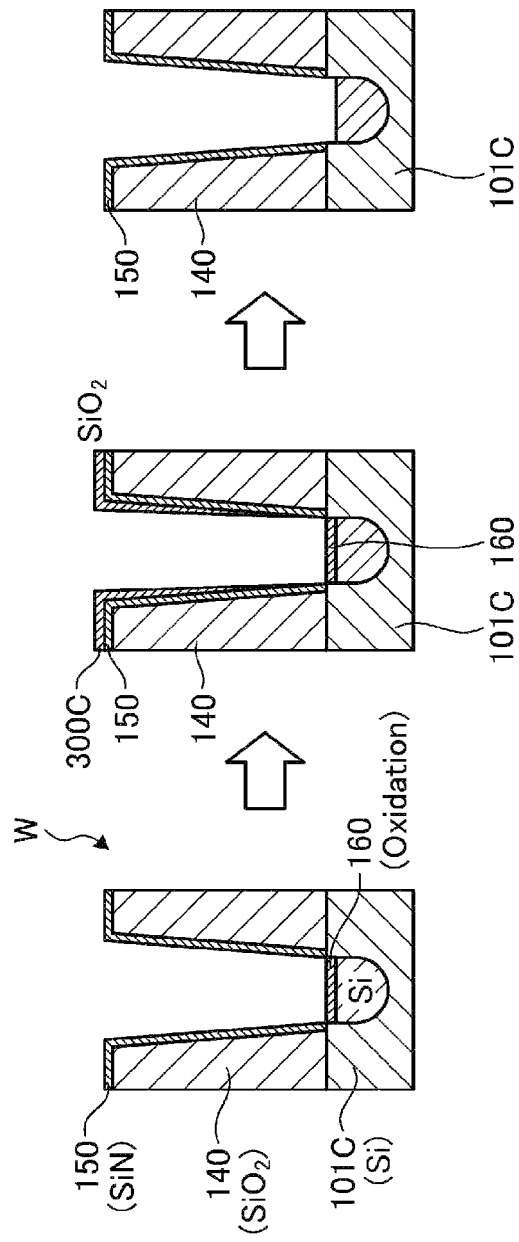

SUBSTRATE PROCESSING METHOD AND SUBSTRATE PROCESSING APPARATUS

CROSS-REFERENCE TO RELATED APPLICATIONS

This application is a continuation application of U.S. patent application Ser. No. 16/804,807, filed on Feb. 28, 2020, which claims from Japanese Patent Application Nos. 2019-036708 filed on Feb. 28, 2019, 2019-203918 filed on Nov. 11, 2019, and 2020-024686 filed on Feb. 17, 2020, the disclosures of which are incorporated herein in their entirety by reference, and priority is claimed to each of the foregoing.

TECHNICAL FIELD

The present disclosure relates to a substrate processing method and a substrate processing apparatus.

BACKGROUND

As the integration of a semiconductor device is progressed not only in the horizontal direction but also in the vertical direction, an aspect ratio of a pattern formed in a process of manufacturing semiconductor devices is also increasing. For example, in manufacturing a 3D NAND, channel holes are formed in a direction that penetrates a large number of metal wiring layers. When 64 layers of memory cells are formed, the aspect ratio of the channel holes is as high as 45.

There have been various methods for precisely forming a pattern with a high aspect ratio. For example, there has been proposed a method of repeating an etching and a film formation on an opening formed of a dielectric material in a substrate, thereby suppressing lateral etching (U.S. Patent Application Publication No. 2016/0343580). Further, there has been proposed a method of combining an etching and a film formation with each other, to form a protective film for preventing a lateral etching of a dielectric layer (U.S. Patent Application Publication No. 2018/0174858).

SUMMARY

According to an aspect of the present disclosure, a substrate processing method which is implemented by a substrate processing apparatus includes steps (a) and (b). Step (a) forms a recess on a workpiece by partially etching the workpiece. Step (b) forms a film having a thickness that differs along a depth direction of the recess. Step (b) includes steps (b-1) and (b-2). Step (b-1) supplies a first reactant, and causes the first reactant to be adsorbed to a side wall of the recess. Step (b-2) supplies a second reactant, and causes the second reactant to react with the first reactant thereby forming a film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A to 2D are views for explaining an example of a pattern formed by the substrate processing method according to the first embodiment.

FIGS. 3A to 3D are views for explaining a suppression of shape abnormality of a semiconductor pattern by the substrate processing method according to the first embodiment.

FIGS. 13A to 13E are views (second part) for explaining a suppression of closing of an opening by the substrate processing method according to the second embodiment.

FIGS. 19A to 19D are views illustrating an example of a workpiece processed by the substrate processing method according to the fourth embodiment.

FIGS. 20A to 20D are views illustrating another example of the workpiece processed by the substrate processing method according to the fourth embodiment.

FIGS. 21A and 21B are views for explaining a relationship between a temperature of a workpiece and a film formation amount.

FIGS. 22A to 22C are views for explaining an example of a workpiece processed by a substrate processing method according to Modification 3.

DETAILED DESCRIPTION

Figure 1:
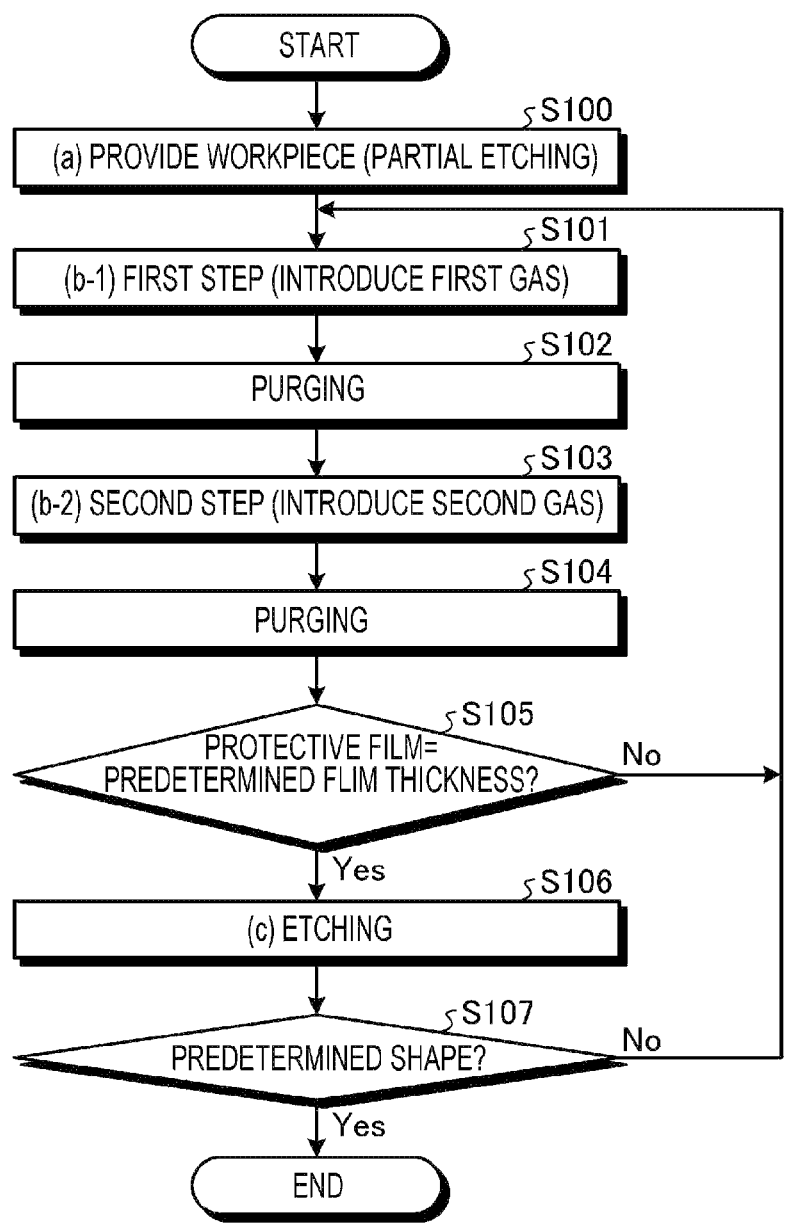
FIG. 1 is a flowchart illustrating an example of flow of a substrate processing method according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of the present disclosure will be described in detail based on the drawings. In addition, the embodiments do not limit the present disclosure. Further, the embodiments may be appropriately combined with each other within a range that does not cause any inconsistency in processing contents. Further, in the respective drawings, the same or corresponding portions will be denoted by the same reference numerals.

It is known that a shape abnormality occurs when a pattern with a high aspect ratio is etched. For example, when an opening is formed in the vertical direction, there occurs a shape abnormality that the inner peripheral surface of the opening expands in the horizontal direction. This shape abnormality is called bowing. There has been proposed a method of forming a protective film on the side wall of an opening in order to suppress the occurrence of shape abnormality. In forming a fine pattern, it is preferable to prevent a closing of the opening due to the protective film or a decrease in etching rate due to a film formation on the bottom of the opening.

In the following description, a "pattern" refers to all shapes formed on a substrate. A pattern indicates all of a plurality of shapes formed on a substrate such as, for example, holes, trenches, and line-and-space. In addition, a "recess" refers to a portion corresponding to a shape dented in a thickness direction of a substrate in a pattern formed on the substrate. Further, the recess has a "side wall" which is the inner peripheral surface of the dented shape, a "bottom" which is the bottom of the dented shape, and a "top" which is continuous with the side wall and is the surface of the substrate near the side wall. In addition, the space surrounded by the top is called an "opening." Further, the term "opening" is also used to indicate the entire space surrounded by the bottom and the side wall of the recess or an arbitrary position in the space.

Example of Flow of Substrate Processing Method according to First Embodiment

FIG. 1 is a flowchart illustrating an example of flow of the substrate processing method according to a first embodiment. First, a workpiece is provided (step S100). For example, a substrate on which a pattern with a high aspect ratio is formed is disposed in a processing chamber. Alternatively, for example, a substrate on which no pattern is formed is disposed in the processing chamber, and partially etched to form a pattern (step (a)). Next, a first gas (hereinafter, also referred to as a precursor or a first reactant) is introduced into the processing chamber (step S101, a first step, or step (b-1)). Next, the processing chamber is purged to discharge the component of the first gas that is excessively adsorbed onto the surface of the workpiece (step S102). Next, a second gas (hereinafter, also referred to as a reaction gas or a second reactant) is introduced into the processing chamber (step S103, a second step, or step (b-2)). Then, the processing chamber is purged to discharge the excessive component of the second gas (step S104). In addition, steps S100 and S101 to S104 may be performed in the same processing chamber (in-situ) or in different processing chambers (ex-situ). Next, it is determined whether a protective film formed on the workpiece in steps S101 to S104 reaches a predetermined film thickness (step S105). The determination of whether the protective film reaches the predetermined film thickness may be performed based on the number of times of performing steps S101 to S104. Alternatively, the determination may be performed based on a measured value of the film thickness of the protective film. The measured value may include a parameter that indicates a state of the protective film such as a distribution of the film thickness. The method of measuring the protective film is not particularly limited, and the protective film may be measured by, for example, an optical method. For in-situ, the film thickness may be measured using a measurement apparatus provided in advance in the processing chamber. Meanwhile, for ex-situ, the film thickness may be measured using a measurement apparatus provided outside the processing chambers. As a result, when it is determined that the protective film does not reach the predetermined film thickness (step S105, No), the process returns to step S101 to repeat steps S101 to S104. In this case, the processing conditions in steps S101 to S104 may be adjusted according to the measured value. Meanwhile, when it is determined that the protective film reaches the predetermined film thickness (step S105, Yes), the workpiece is etched (step S106). At this time, the etching condition may be adjusted according to the measured value that is obtained in step S105. Then, it is determined whether the etched pattern has a predetermined shape (step S107). The determination of whether the etched pattern has the predetermined shape may be performed based on the number of times of performing step S106. Alternatively, the determination may be performed based on a measured value of the shape of the etched pattern. The method of measuring the shape of the etched pattern is not particularly limited, and the shape of the etched pattern may be measured by, for example, an optical method. For in-situ, the shape of the etched pattern may be measured using a measurement apparatus provided in advance in the processing chamber. Meanwhile, for ex-situ, the shape of the etched pattern may be measured using a measurement apparatus provided outside the processing chambers. As a result, when it is determined that the etched pattern does not have the predetermined shape (step S107, No), the process returns to step S101 to repeat the first and second steps. Meanwhile, when it is determined that the etched pattern has the predetermined shape (step S107, Yes), the process is ended. This flow is an example of the process flow of the substrate processing method according to the first embodiment.

In the process illustrated in FIG. 1, the processing conditions in the first and second steps are set such that the coverage of the protective film by at least one of the first and second gases along the depth direction of the pattern changes. The coverage refers to an area ratio of a protective film formed to have a predetermined film thickness per unit area. That is, the processing conditions are set such that the film thickness of the protective film formed in the first and second steps changes in the depth direction of the pattern. In addition, the purging in steps S102 and S104 may be omitted.

In addition, the determination in step S105 is performed based on, for example, whether steps S101 to S104 have been performed a predetermined number of times. Further, the determination in step S107 is performed based on, for example, whether step S106 has been performed on the same workpiece a predetermined number of times. In addition, the etching in step S106 may be performed a plurality of times.

In addition, steps S101 and S103 may be performed using plasma or may be performed without using plasma. In addition, the respective steps may be performed in the same processing chamber while maintaining a depressurized atmosphere, or may be performed in different processing chambers. In addition, when the steps are performed in different processing chambers, the steps may be performed while maintaining the depressurized atmosphere or may be performed passing through a normal pressure atmosphere.

FIGS. 2A to 2D are views for explaining an example of a pattern formed by the substrate processing method according to the first embodiment. The substrate processing method of the first embodiment will be further described with reference to FIGS. 2A to 2D.

A workpiece S illustrated in FIGS. 2A to 2D includes an etching target film 102 and a mask 120 which are stacked on a substrate 101. First, the workpiece S is disposed in the processing chamber. Next, in step S101, the first gas is introduced into the processing chamber. The first gas is adsorbed to a top 200T, a side wall 200S, and a bottom 200B that surrounds an opening 200, so as to form the layer illustrated in FIG. 2A. After the processing chamber is purged, the second gas is introduced into the processing chamber in step S103 (FIG. 2B). The processing conditions in steps S101 and S103 are set such that the reaction between the component of the second gas and the component of the first gas adsorbed onto the workpiece S is not completed on the entire surface layer of the workpiece S. After a processing time based on the set processing conditions elapses, the processing chamber is purged. The second gas reacts with the first gas on the top 200T and the upper portion of the side wall 200S, thereby forming a protective film 300 (FIG. 2C). Thereafter, steps S101 to S104 are repeated such that a protective film 301 having a desired film thickness is formed (FIG. 2D). Then, in step S106, the etching target film 102 is etched. Since the protective film 301 is formed in advance at the portion where the shape abnormality occurs due to the etching, the occurrence of shape abnormality after the etching is prevented.

(Suppression of Shape Abnormality)

FIGS. 3A to 3D are views for explaining the suppression of shape abnormality of a semiconductor pattern by the substrate processing method according to the first embodiment. The workpiece S illustrated in FIG. 3A is the same as the workpiece S illustrated in FIG. 2D, and the protective film 301 is formed on the top 200T and the side wall 200S. In the etching, bowing often occurs at a position where the mask is switched to the etching target film. For example, bowing often occurs at the position R1 indicated in FIG. 3A. However, in the example of FIGS. 3A to 3D, the protective film 301 is formed at the position R1 to become thinner in the depth direction of the pattern. Accordingly, after the workpiece S is etched, the protective film 301 is shaved much at the position R1, so that an opening dimension in the depth direction becomes uniform, as illustrated in FIG. 3B. As the etching is repeated, the protective film 301 is further shaved, so that the opening dimension becomes substantially uniform from the upper portion toward the lower portion of the opening 200 as illustrated in FIG. 3C, and for example, becomes the shape illustrated in FIG. 3D. When bowing of the protective film 301 occurs due to the etching (corresponding to No in step S107), the first and second steps are performed again to form the protective film 301 again. In this way, according to the substrate processing method according to the first embodiment, the shape abnormality of a semiconductor pattern may be suppressed.

(ALD Control for Changing Film Thickness in Depth Direction of Pattern)

As described above, in the substrate processing method according to the first embodiment, the protective film of which coverage (film thickness) decreases in the depth direction is formed on the inner peripheral surface of the opening. As for a method of forming the protective film, for example, a chemical vapor deposition or an atomic layer deposition (ALD) may be used. The substrate processing method according to the first embodiment forms the protective film having a film thickness that differs in the depth direction of the opening, while changing the coverage in the depth direction of the opening by using a self-controllability of a film formed by the ALD.

Prior to describing the substrate processing method according to the first embodiment, the so-called ALD will be described. The ALD typically includes four processing steps. First, the first gas (also referred to as a precursor) is introduced into a processing chamber in which a workpiece, for example, a substrate is disposed. A first material included in the first gas is adsorbed on the surface of the workpiece. After the surface of the workpiece is covered with the first material, the processing chamber is evacuated. Next, the second gas that includes a second material reacting with the first material (also referred to as a reaction gas) is introduced into the processing chamber. The second material reacts with the first material on the workpiece, thereby forming a film. When the reaction with the first material on the surface is completed, the film formation is ended. The ALD forms a film by causing a predetermined material to be adsorbed to and react with a material existing in advance on the surface of the workpiece in a self-controlled manner. Thus, the ALD typically implements a conformal film formation by providing a sufficient processing time.

Meanwhile, the substrate processing method according to the first embodiment sets the processing conditions such that the self-controlled adsorption or reaction on the surface of the workpiece is not completed. At least two processing aspects are provided below.

(1) The precursor is adsorbed to the entire surface of the workpiece. A control is performed to suppress the reaction gas introduced thereafter from spreading over the entire surface of the workpiece evenly.

(2) The precursor is adsorbed to only a portion of the surface of the workpiece. The reaction gas introduced thereafter forms a film only on the portion of the surface to which the precursor is adsorbed.

The substrate processing method according to the first embodiment uses the method (1) or (2), to suppress the protective film from being formed on the lower portion of the side wall of the opening and the bottom of the opening in the semiconductor pattern.

FIGS. 4A to 4D are views for explaining a first example of the substrate processing method according to the first embodiment. The workpiece illustrated in FIGS. 4A to 4D includes an etching target film EL1 and a mask MA which are formed on a substrate (not illustrated). A recess having an opening OP is formed in the stacked body of the etching target film EL1 and the mask MA.

Figure 4A:
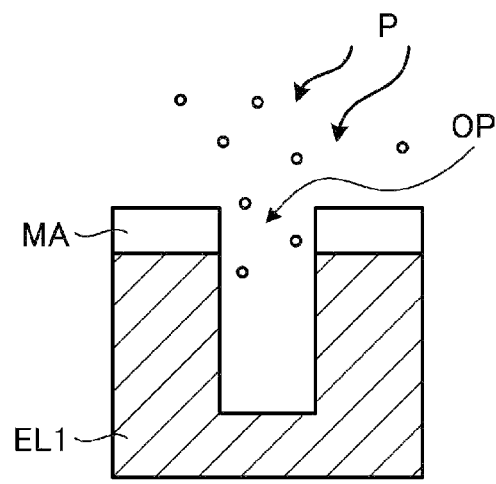
FIGS. 4A to 4D are views for explaining a first example of the substrate processing method according to the first embodiment.
Figure 4B:
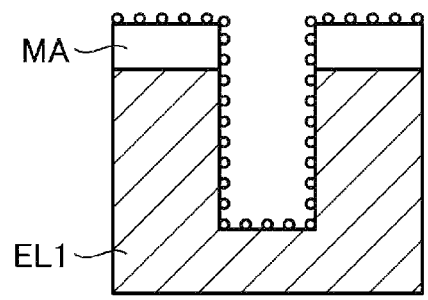
Figure 4C:
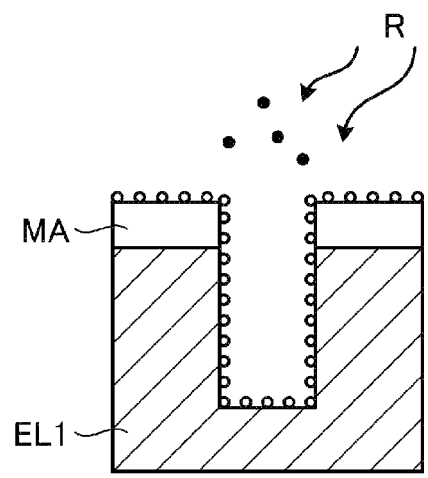
Figure 4D:
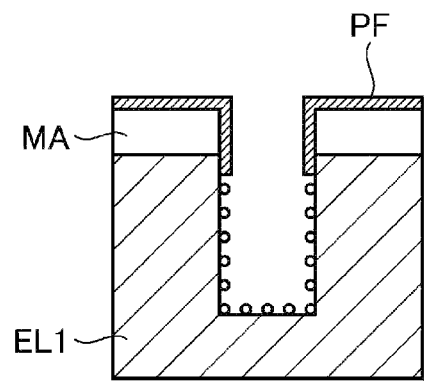

First, a precursor P is introduced into the processing chamber in which the workpiece is disposed (FIG. 4A). By providing a sufficient processing time for the adsorption of the precursor P, the precursor P is adsorbed to the entire surface of the workpiece (FIG. 4B). When the adsorption of the precursor P is completed, the processing chamber is purged. Next, a reaction gas R is introduced into the processing chamber (FIG. 4C). The introduced reaction gas R reacts with the precursor P on the workpiece, thereby forming a protective film PF gradually from the top of the mask MA. Here, the reaction gas R is purged before the protective film PF being formed reaches the lower portion of the etching target film EL1 With this processing, it is possible to form the protective film PF only on the mask MA and the upper portion of the etching target film EL1 rather than on the entire side wall of the recess, using the ALD method (FIG. 4D). In FIG. 4D, the protective film PF is formed on the upper portion of the side wall of the recess and the top of the recess, and is not formed on the lower portion of the side wall of the recess and the bottom of the recess.

Figures 5A, 5B, 5C:
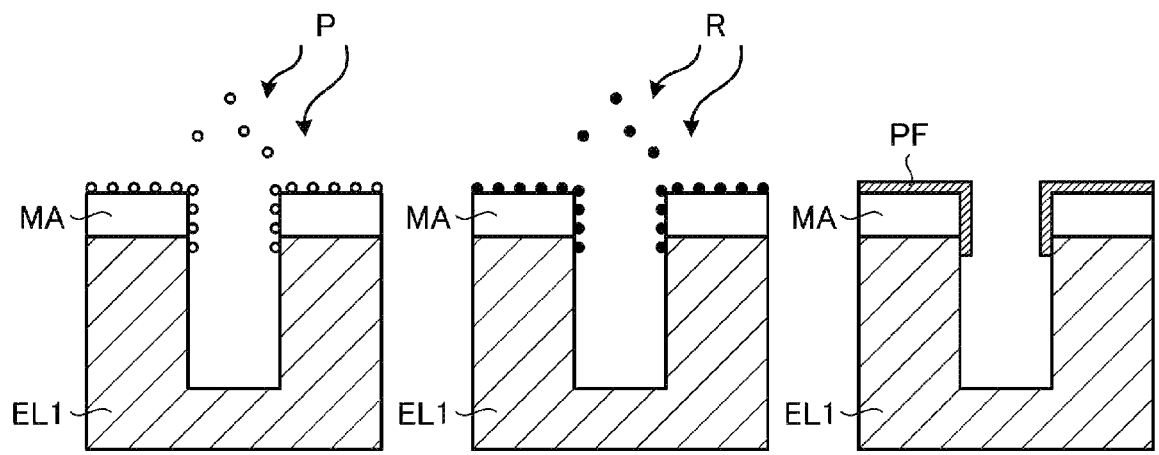
FIGS. 5A to 5C are views for explaining a second example of the substrate processing method according to the first embodiment.

FIGS. 5A to 5C are views for explaining a second example of the substrate processing method according to the first embodiment. The workpiece illustrated in FIGS. 5A to 5C has the same shape as that of the workpiece of FIGS. 4A to 4D.

In the example of FIGS. 5A to 5C, the precursor P is adsorbed only to the upper portion of the workpiece (FIG. 5A). After the precursor P is purged, the reaction gas R is introduced into the processing chamber (FIG. 5B). At this time, since the reaction gas R reacts with the precursor P and forms a film only on the position to which the precursor P is adsorbed, the protective film PF is formed only on the upper portion of the workpiece (FIG. 5C).

(Processing Conditions for Selective Adsorption and Reaction)

As described above, in the substrate processing method according to the first embodiment, the adsorption of the precursor in the second example or the reaction of the reaction gas in the first example occurs at a predetermined portion of the pattern. For example, since the protective film is formed only on the upper portion of the opening of the pattern, the processing conditions are adjusted such that the adsorption of the precursor or the reaction of the reaction gas occurs only at the upper portion of the opening of the pattern.

The processing parameters to be adjusted for implementing the substrate processing method are, for example, the temperature of the stage on which the workpiece is disposed, the pressure in the processing chamber, the flow rate and the introduction time of the precursor to be introduced, and the gas flow rate and the introduction time of the reaction gas to be introduced, and the processing time. In addition, when a processing is performed using plasma, the position of the film formation may also be adjusted by adjusting a value of a radio-frequency (RF) power applied for generating plasma.

Figure 6:
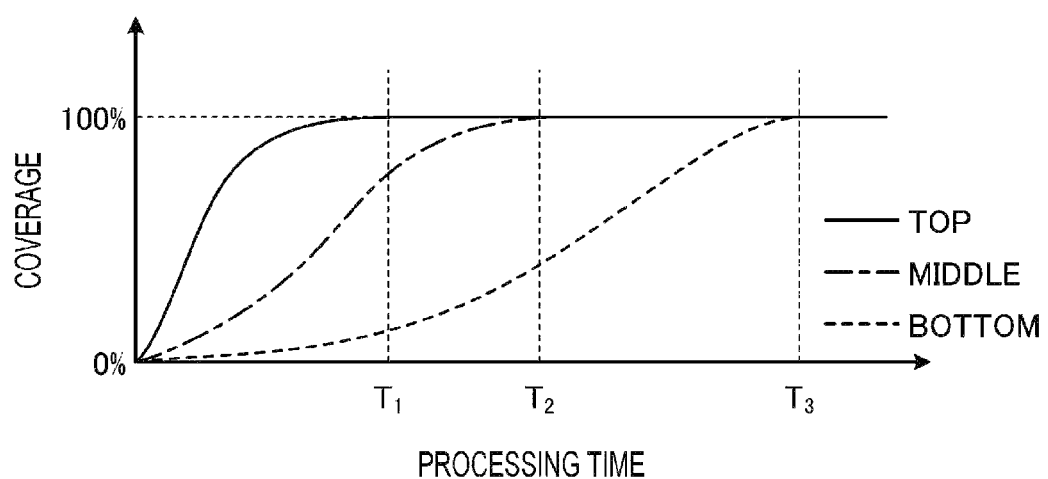
FIG. 6 is a view for explaining a control of coverage of a protective film formed by the substrate processing method according to the first embodiment.

FIG. 6 is a view for explaining a control of the coverage of the protective film formed by the substrate processing method according to the first embodiment. In FIG. 6, the horizontal axis represents the processing time, and the vertical axis represents the coverage. Further, the solid line represents the coverage at the top TOP of the recess of the pattern, the alternate long and short dash line represents the coverage at the center MIDDLE of the side wall of the recess, and the dashed line represents the coverage at the bottom BOTTOM of the recess. Further, FIG. 6 represents an approximate tendency, rather than exact numerical values.

As illustrated in FIG. 6, when the film formation is performed in the recess of the pattern, the rate of the film formation (adsorption or reaction) differs at each of the top, the center of the side wall, and the bottom of the recess. The film formation is progressed gradually from the top to which the precursor or the reaction gas is initially introduced, toward the bottom. First, as represented by the solid line in FIG. 6, the coverage at the top gradually increases, and the film formation on the top is completed earliest among the film formations at the portions of the recess (timing $T_1$, coverage 100%). Next, as represented by the alternate long and short dash line, the film formation on the center of the side wall is progressed in a slightly slower rate than that on the top, and completed at a timing $T_2$ which is slightly later than the timing at which the film formation on the top is completed. Next, as represented by the dashed line, the film formation on the bottom is progressed, and completed at a timing $T_3$ which is the latest among the timings for the portions of the recess.

Accordingly, when the adsorption of the precursor or the reaction of the reaction gas is ended at a timing after the timing $T_1$ and before the timing $T_3$, the processing may be ended in a state where the precursor is adsorbed to or the protective film is formed on the top of the recess, but the adsorption of the precursor or the formation of the protective film to/on the center of the side wall or the bottom is not completed.

In FIG. 6, the coverage is plotted by setting the processing time as a processing parameter on the horizontal axis. Alternatively, the coverage may also be adjusted by fixing the processing time, and changing the temperature of the stage, the pressure in the processing chamber, the gas flow rate (dilution degree) of the precursor or the reaction gas, or an absolute value of the radio-frequency (RF) power applied for generating plasma. For example, by setting the temperature of the stage to be low, the progress of the film formation on the lower portion of the pattern may be made slow. In addition, by setting the pressure in the processing chamber to be low, the progress of the film formation on the lower portion of the pattern may be made slow. In addition, by setting the flow rate of the precursor included in a gas to be introduced to be low, the progress of the adsorption to the lower portion of the pattern may also be made slow. In addition, by setting the flow rate of the reaction gas to be introduced to be low, the progress of the film formation on the lower portion of the pattern may also be made slow. In addition, when plasma is used, the progress of the film formation on the lower portion of the pattern may be made slow, by setting an absolute value of the radio-frequency power applied for generating plasma to be low.

For example, each of the temperature of the stage, the pressure in the processing chamber, the dilution degree of the gas to be introduced (precursor), and the absolute value of the radio-frequency power is set to a smaller value than a value at which the adsorption of the precursor to the entire surface of the workpiece is completed, when the other processing conditions are the same. In addition, for example, each of the temperature of the stage, the pressure in the processing chamber, and the absolute value of the radio-frequency power is set to a smaller value than a value at which the reaction of the reaction gas on the entire surface of the workpiece is completed, when the other processing conditions are the same. In addition, the dilution degree of the gas to be introduced (reaction gas) is set to a higher value than the value at which the reaction of the reaction gas on the entire surface of the workpiece is completed, when the other processing conditions are the same.

In the substrate processing method according to the first embodiment, the processing conditions are adjusted as described above, such that the processing is ended in a state where the adsorption of the precursor represented in the second example or the reaction of the reaction gas represented in the first example is unsaturated. As a result, the protective film may be formed only on the upper portion of the pattern by the substrate processing method according to the first embodiment.

Figure 7A:
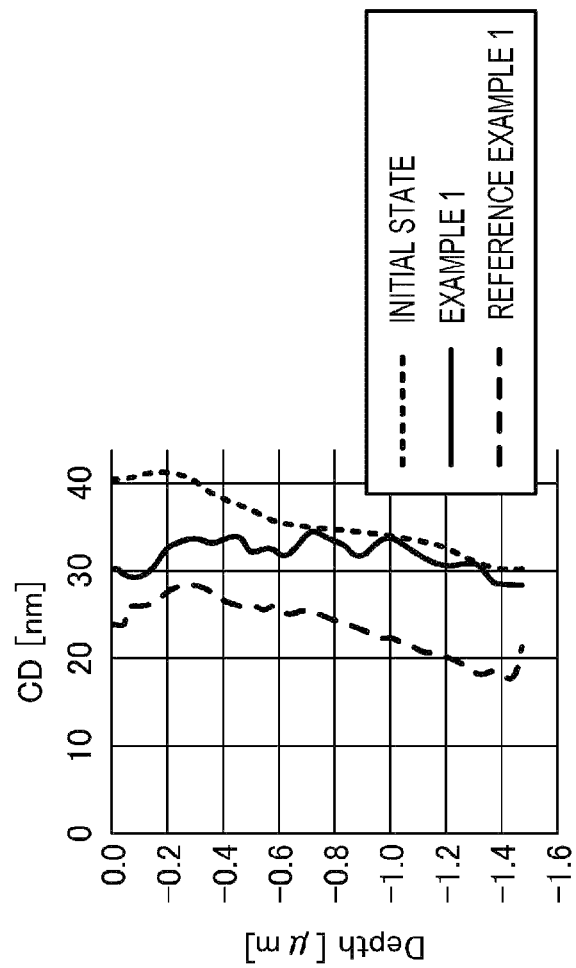
FIGS. 7A and 7B are views for explaining a film thickness of the protective film formed by the substrate processing method according to the first embodiment.
Figure 7B:
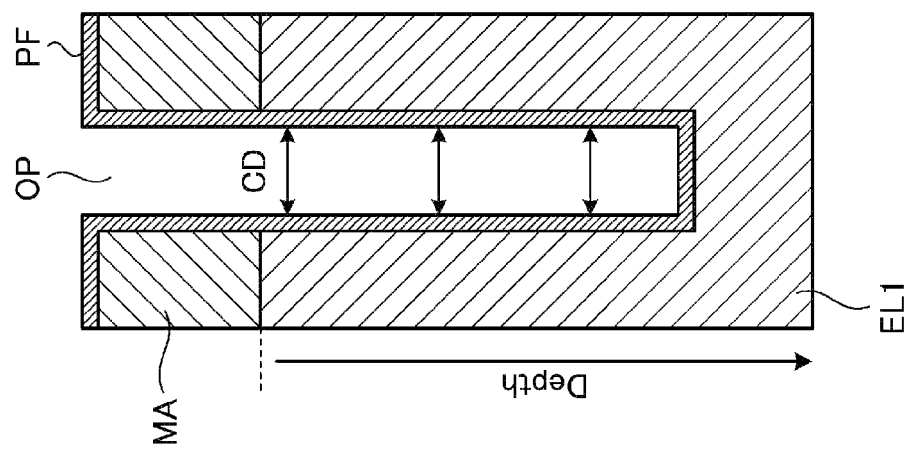

Film Thickness of Protective Film Formed by
Substrate Processing Method according to First
Embodiment FIGS. 7A and 7B are views for explaining the film thickness of the protective film formed by the substrate processing method according to the first embodiment. As described above, in the first embodiment, the processing conditions are adjusted such that the protective film is formed on the upper portion of the pattern. The inventors of the present disclosure processed a workpiece using the substrate processing method according to the first embodiment, and examined the film thickness of the formed protective film. FIG. 7A is a schematic view of the workpiece used in the experiment. The workpiece includes the etching target film EL1, the mask MA formed on the etching target film EL1, and the recess formed in the mask MA and the etching target film EL1 and having the opening OP. FIG. 7A represents a state where the protective film PF is formed on the entire inner surface of the recess. The CD refers to a horizontal dimension of the space surrounded by the side wall of the recess at an arbitrary position in the space.

FIG. 7B represents plots of an opening dimension in the initial state of the workpiece, an opening dimension after a processing according to Example 1 is performed, an opening dimension after a processing according to Reference Example 1 is performed, in association with the depth of the opening in the etching target film EL1 The initial state refers to a state before the protective film PF is formed. Example 1 corresponds to a case where the protective film is formed on the workpiece by the substrate processing method according to the first embodiment. Specifically, the processing time for the reaction of the reaction gas is set to be short (see the timing $T_2$ in FIG. 6). Reference Example 1 corresponds to a case where the protective film is formed on the workpiece by the normal ALD. The normal ALD refers to an ALD that implements the conformal film formation by providing a sufficient time until each of the absorption of the precursor and the reaction of the reaction gas to/on the entire surface of the workpiece is completed.

As represented in FIG. 7B, first, in the initial state, the opening dimension is about 40 nanometers (nm) at the depth position of about 0.0 micrometer (μm), and about 30 nm at the depth position of about 1.4 μm. That is, as the depth increases, the opening dimension decreases. After the normal ALD is performed, the protective film is formed to have a substantially constant film thickness, regardless of the depth. The opening dimension at the depth position of about 0.0 μm is about 25 nm, and the opening dimension at the depth position of about 1.4 μm is about 18 nm. While there is a slight error according to the depth, the protective film of about 12 nm to 15 nm is formed. Meanwhile, after the processing by the substrate processing method according to the first embodiment (Example 1) is performed, the opening dimension at the depth position of about 0.0 μm is 30 nm, and the opening dimensions at the depth positions of about 0.4 μm and about 1.3 μm are about 34 nm and 30 nm, respectively. That is, the film thickness of the formed protective film gradually decreases from the top toward the bottom of the recess. The film thickness of the protective film formed by the substrate processing method according to the first embodiment gradually changes from the upper portion toward the lower portion of the recess. That is, the substrate processing method according to the first embodiment forms the protective film which is not conformal, that is, a sub-conformal protective film, using the ALD method.

Figure 8:
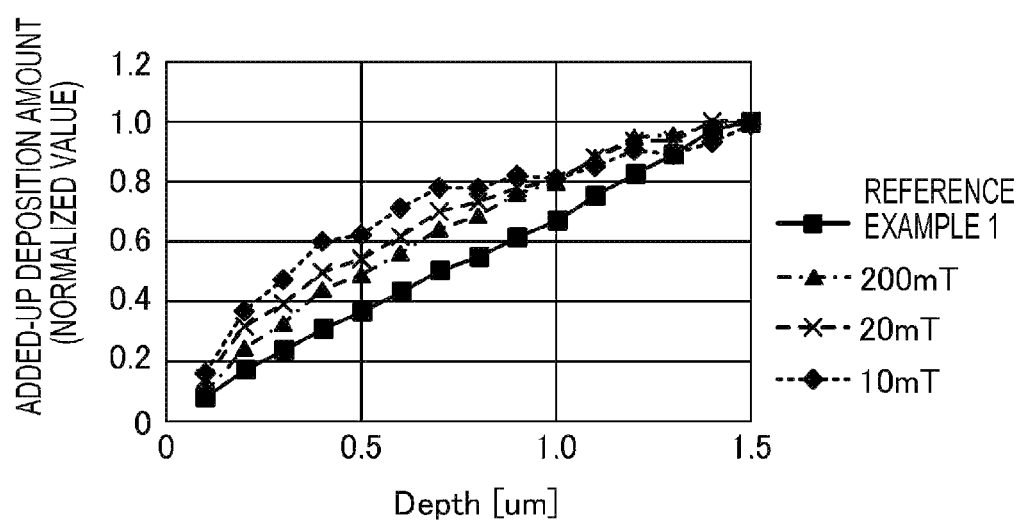
FIG. 8 is a view for explaining a relationship between the film thickness of the protective film formed by the substrate processing method according to the first embodiment and a pressure in a processing chamber.

FIG. 8 is a view for explaining a relationship between the distribution of the film thickness of the protective film formed by the substrate processing method according to the first embodiment in the depth direction and the pressure in the processing chamber. When the processing conditions other than the pressure are constant, a total deposition amount of the deposited film largely differs according to the pressure. Thus, the total deposition amount obtained by adding up the film thickness of the deposited film up to the depth of 1.5 μm is normalized to 1, and a ratio of a deposition amount from the depth of 0 μm to a predetermined depth is plotted to represent differences among the conditions. Reference Example 1 of FIG. 8 corresponds to a case where the protective film is formed on the workpiece by the normal ALD. In the normal ALD, since the conformal film formation is implemented, the film thickness is constant in the depth direction. Thus, a primary curve is drawn in the graph of FIG. 8. In addition, the other graphs of FIG. 8 represent the distributions of the film thickness in a case where among the processing conditions of Example 1 in FIG. 7B, the pressure in the processing chamber when the reaction of the reaction gas is conducted is changed to 200 mTorr (mT), 20 mT, and 10 mT. As represented in FIG. 8, it may be seen that for any of the pressure values, the total deposition amount of the deposited film at the relatively shallow depth position is larger than that in Reference Example 1. That is, the graphs represent that the sub-conformal protective film is formed. In particular, it may be seen that the total deposition amount of the deposited film at the relatively shallow depth position is large in a case where the pressure is 10 mT. In other words, in order to change the film thickness of the protective thickness according to the depth and increase the film thickness toward the top, it is preferable to set the pressure in the processing chamber to be low.

In addition, the inventors of the present disclosure used oxygen gas ($O_2$) as the reaction gas and a substrate having a pattern with an aspect ratio of about 10 as the workpiece, and examined the change of the film thickness of the protective film according to the dilution degree of the oxygen gas, among the processing conditions of Example 1 in FIG. 7B, when the reaction of the reaction gas was conducted. The dilution degree of the oxygen gas refers to a ratio of a diluting gas to the total flow rate of the oxygen gas and the diluting gas. The dilution degree of the oxygen gas may be represented by being replaced with a partial pressure of the diluting gas. In addition, the diluting gas refers to a gas that does not contribute to a reaction and is composed of a non-reactant such as a rare gas. $O_2$ was used as the reaction gas, argon gas was used as the diluting gas, and a mixture of $O_2$ and argon gas at a predetermined ratio was used. As a result, the film thickness of the protective film changed according to the depth of the recess, and the change of the film thickness increased as the dilution degree of $O_2$ was high. This is believed to be because it is easy for O radicals to spread sufficiently and evenly over the bottom of the recess, and the amount of O radicals supplied to the bottom is suppressed by increasing the dilution degree.

As described above, the substrate processing method according to the first embodiment forms the film having the self-controllability such that the film has the different coverage and film thickness along the depth direction of the pattern, by using the ALD method and adjusting the processing conditions.

(Improvement of Etching Rate)

Figure 9:
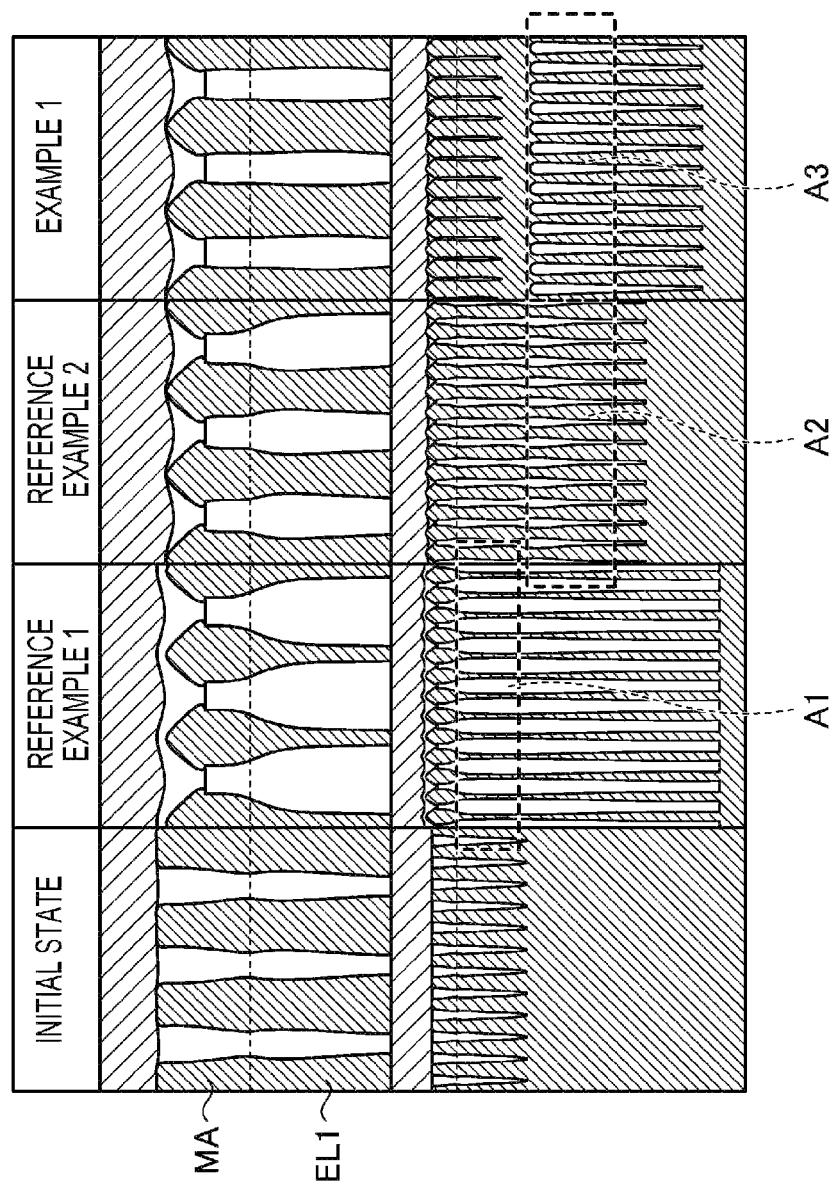
FIG. 9 is a view for explaining an improvement of an etching rate when the substrate processing method according to the first embodiment is used.

FIG. 9 is a view for explaining an improvement of an etching rate by the substrate processing method according to the first embodiment. FIG. 9 represents an experimental result obtained in a case where a mask MA of a silicon oxynitride film is stacked on an amorphous carbon layer which is the etching target film EL1 and the amorphous carbon layer is etched using a pattern formed on the mask.

The leftmost view (initial state) of FIG. 9 represents a state of the workpiece at the start time of the processing. In the initial state, the opening dimension is slightly large near the top of the etching target film EL1 and the opening has a shape tapered in the depth direction.

The second leftmost view of FIG. 9 (Reference Example 1) represents a result obtained when the workpiece in the initial state is directly etched. In Reference Example 1, the opening dimension is largely expanded below the mask, and bowing occurs (the portion "A1" in FIG. 9). The second rightmost view of FIG. 9 (Reference Example 2) represents a result obtained when etching is performed after a protective film is formed by the normal ALD. Upon a comparison with Reference Example 1, the occurrence of bowing in the etching target film immediately below the mask is suppressed (the portion "A2" in FIG. 9), but the depth of the recess formed by the etching is largely reduced. The rightmost view of FIG. 9 (Example 1) represents a result obtained when etching is performed after a protective film is formed using the substrate processing method according to the first embodiment. Upon a comparison with Reference Example 2, the suppression degree of the occurrence of bowing is substantially the same (the portion "A3" in FIG. 9), but the depth of the recess formed by etching largely increases.

When the protective film is formed by the normal ALD, the protective film is formed not only on the side wall of the recess but also on the bottom of the recess. Accordingly, the protective film acts as an etching stop layer, and thus, the etching rate decreases. In the meantime, in the substrate processing method according to the first embodiment, the film formation on the bottom of the recess is suppressed, and the protective film is formed on the side wall of the recess. Since the protective film is suppressed from being formed on the bottom of the recess and acting as an etching stop layer, the decrease of the etching rate may be suppressed.

In addition, in the substrate processing method according to the first embodiment, since the film formation on the side wall of the recess near the bottom of the recess is suppressed, the dimension of the bottom of the recess may be controlled. For example, in a case where a recess is formed to have a diameter that is reduced from the top toward the bottom, a control may be implemented to increase the dimension of the bottom while suppressing the change of the dimension of the side wall by the protective film.

Further, in the substrate processing method according to the first embodiment, since the film formation is performed using the ALD method, a fine control of the film thickness is possible. Thus, the opening is prevented from being closed at the top of the recess.

(Film Type of Workpiece)

In addition, the type of the etching target film 102 in the first embodiment is not particularly limited. The etching target film 102 may be, for example, a silicon-containing film, a carbon-containing film, an organic film or a metal film. The silicon-containing film may be a silicon dielectric film, and examples of the silicon-containing film include a silicon oxide film, a silicon nitride film, a silicon oxynitride film, and silicon carbide.

In addition, the types of the protective films 300 and 301 formed by the substrate processing method according to the first embodiment may be the same as the type of the etching target film 102. For example, each of the protective films 300 and 301 may be a silicon-containing film, a carbon-containing film, an organic film or a metal film. The carbon-containing film is, for example, an amorphous carbon layer (ACL) or a spin-on-carbon film. In addition, the silicon-containing dielectric film is, for example, a silicon oxide film (SiO), a silicon nitride film (SiN), a silicon oxynitride film (SiON) or a combination thereof. The metal film is, for example, a titanium (Ti) film or a tungsten (W) film. As described above, when the types of the protective films 300 and 301 and the etching target film 102 are the same, it becomes easy to control a subsequent processing. For example, at the time of etching, the etching rates of the protective films 300 and 301 and the etching target film 102 may become uniform. Thus, the dimension of the bottom 200B may be easily controlled during the etching after the protective films 300 and 301 are formed. For example, when the types of the protective films 300 and 301 are different from the type of the etching target film 102, it may be considered that the protective films 300 and 301 are not removed and remain in the subsequent etching step, and thus, the bottom 200B of the etching target film 102 is excessively shaved. Meanwhile, when the types of the protective films 300 and 301 and the etching target film 102 are the same, the amount removed by etching may be easily controlled. In addition, when the protective films 300 and 301 are removed in the subsequent processing, the protective films 300 and 301 may be removed together with the etching target film 102 without providing a separate step for removing the protective films 300 and 301.

In addition, the etching target film 102 may be a stacked film in which a plurality of layers is stacked. For example, the etching target film 102 may be an ONON film (silicon oxide film/silicon nitride film) or an OPOP film (silicon oxide film/polysilicon).

In addition, when a silicon oxide film is formed as each of the protective films 300 and 301, an aminosilane-based gas, $SiCl_4$, $SiF_4$ or the like may be used as the precursor, and an oxygen-containing gas such as, for example, $O_2$ may be used as the reaction gas. In addition, when a silicon nitride film is formed as each of the protective films 300 and 301, an aminosilane-based gas, $SiCl_4$, dichlorosilane (DCS), hexachlorodisilane (HCDS) or the like may be used as the precursor, and a nitrogen-containing gas such as, for example, $N_2$ or $NH_3$ may be used as the reaction gas. In addition, as a method of forming an organic film as each of the protective films 300 and 301, a molecular layer deposition (MLD) may be used. In addition, when a titanium film or a titanium oxide film is formed as each of the protective films 300 and 301, TDMAT (tetrakis(dimethylamino)titanium) or titanium tetrachloride ($TiCl_4$) may be used as the precursor, and a reducing gas or an oxidizing gas may be used as the reaction gas. In addition, when a tungsten film is formed, $WF_6$ may be used as the precursor, and a reducing gas may be used as the reaction gas.

In addition, the precursor may be selected to control the depth of the protective films 300 and 301 to be formed. For example, as for the selection of the precursor for forming the protective films 300 and 301 only on the further upper portion of the pattern among aminosilane-based gases, it is preferable to use aminosilane gas having two or three amino groups (divalent or trivalent aminosilane), rather than aminosilane gas having one amino group (monovalent aminosilane). In addition, in order to form the protective films 300 and 301 at a deep position of the pattern, it is preferable to use monovalent aminosilane gas. In addition, by a combination with the processing parameters such as the processing time, the temperature of the stage, and the pressure in the processing chamber, the controllability of the unsaturated state may be improved.

In addition, plasma may be generated during the supply of the precursor and the reaction gas. For example, the precursor and the reaction gas may be dissociated by the plasma to generate radicals of the precursor having a relatively high adsorbability and radicals of the reaction gas having a relatively high reactivity, so that the adsorption of the precursor and the reaction of the reaction gas may be promoted. In addition, the plasma may not be necessarily generated as long as the precursor and the reaction gas react with each other sufficiently and spontaneously.

In addition, the substrate processing method according to the first embodiment is not limited to, for example, a 3D NAND or a DRAM, and may be applied to the manufacture of a semiconductor device having a pattern with a high aspect ratio. For example, the substrate processing method according to the first embodiment may be applied to a processing of an organic film with a high aspect ratio which is used for a multilayer resist mask or the like. Here, the high aspect ratio means that the ratio of the depth of the recess to the width of the recess is at least 5 or 10 or more.

Second Embodiment—Control Using Inhibitor

Figure 10:
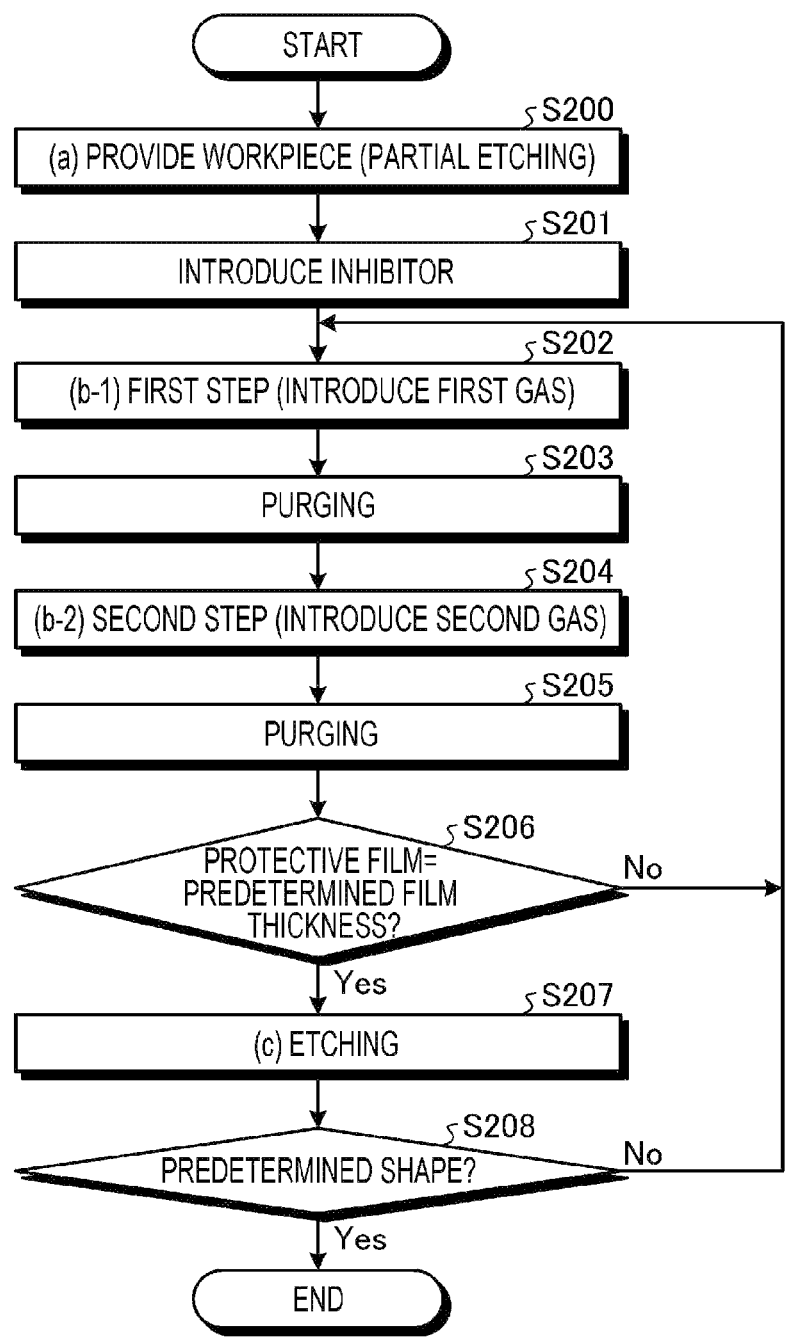
FIG. 10 is a flowchart illustrating an example of flow of a substrate processing method according to a second embodiment.
Figure 11A:
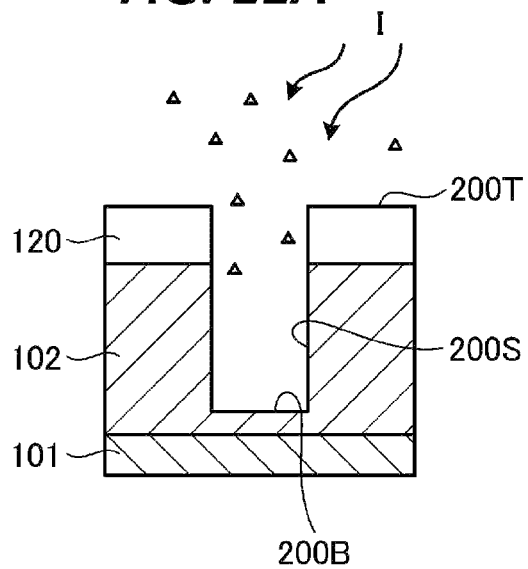
FIGS. 11A to 11E are views illustrating an example of a pattern formed by the substrate processing method according to the second embodiment.

FIG. 10 is a flowchart illustrating an example of flow of a substrate processing method according to a second embodiment. FIGS. 11A to 11E are views illustrating an example of a pattern formed by the substrate processing method according to the second embodiment. In addition, the workpiece illustrated in FIG. 11A is the same as the workpiece in FIG. 2A. In the first embodiment, the sub-conformal film formation is implemented by adjusting the adsorption position or the reaction position of at least one of the first gas and the second gas. In the second embodiment, the adsorption position of the precursor is controlled by forming a factor for inhibiting the adsorption of the precursor (hereinafter, also referred to as an inhibitor) in advance on a portion of the surface of the workpiece. For example, a factor for forming a hydrophobic group that inhibits the adsorption of the precursor is formed on the upper portion of the workpiece by the CVD.

Figure 11B:
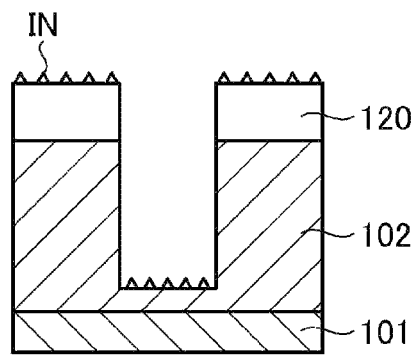

First, the workpiece is provided (step S200). For example, a substrate on which a pattern with a high aspect ratio is formed is disposed in the processing chamber, as in the first embodiment. Alternatively, for example, a substrate on which no pattern is formed is disposed in the processing chamber, and partially etched to form a pattern. Next, a gas containing an inhibitor for inhibiting the adsorption of the first gas is introduced into the processing chamber (step S201). The gas containing the inhibitor is, for example, a gas containing carbon. The gas containing carbon is, for example, fluorocarbon gas, fluorohydrocarbon gas or hydrocarbon gas. In FIG. 11A, when plasma CVD is performed using fluorocarbon gas, a fluorocarbon film is formed as an inhibitor layer IN. In addition, in FIG. 11A, when plasma CVD is performed using fluorohydrocarbon gas, a fluorohydrocarbon film is formed as an inhibitor layer IN. In addition, in FIG. 11A, when plasma CVD is performed using hydrocarbon gas, a hydrocarbon film is formed as an inhibitor layer IN. The fluorocarbon film, the fluorohydrocarbon film, and the hydrocarbon film are hydrophobic films. Here, the processing conditions of the plasma CVD are adjusted to form the inhibitor layer IN as illustrated in FIG. 11B. In the example of FIG. 11B, the inhibitor layer IN is formed on the top 200T and the bottom 200B.

Figure 11C:
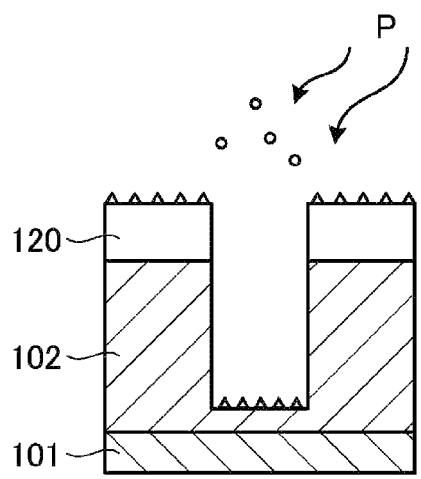
Figure 11D:
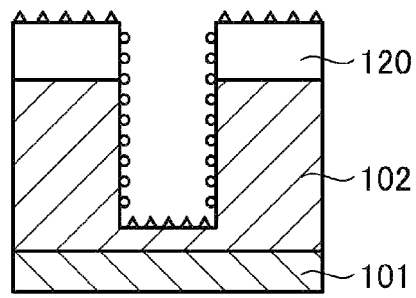
Figure 11E:
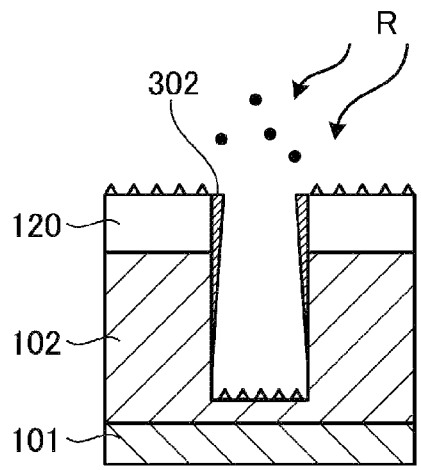

Next, as illustrated in FIG. 11C, the first gas (the precursor P, the first reactant) is introduced into the processing chamber (step S202, the first step). The precursor P is not absorbed to the portions on which the inhibitor layer IN is formed. Thus, the precursor P is selectively adsorbed to the side wall 200S (see FIG. 11D). After the processing chamber is purged (step S203), the second gas (the reaction gas R, the second reactant) is introduced into the processing chamber (step S204, the second step, FIG. 11E). The reaction gas R reacts with the atoms of the precursor P only at the position to which the precursor P is adsorbed, so as to form a protective film 302. Thus, as illustrated in FIG. 11E, the protective film 302 is formed only on the side wall 200S. Further, the processing chamber is purged (step S205). Steps S206 to S208 are the same as steps S105 to S107 in FIG. 1.

In the second embodiment, for example, an aminosilane-based gas, a silicon-containing gas, a titanium-containing gas, a hafnium-containing gas, a tantalum-containing gas, a zirconium-containing gas or an organic-containing gas may be used as the precursor P. The precursor P is adsorbed only to the region on which the inhibitor layer IN is not formed, so as to form a precursor layer. In addition, when the precursor P is adsorbed, plasma may or may not be generated.

After the precursor P is introduced and before the reaction gas R is introduced, the purging step is performed using an inert gas such as argon or nitrogen gas, to reduce or remove the precursor P remaining in the processing chamber, mainly in the gas phase. In addition, the purging step may be performed by evacuating the inside of the processing chamber. The excessively adsorbed precursor P is removed by the purging, and the precursor layer becomes substantially a monolayer.

In addition, the reaction gas R is, for example, an oxygen-containing gas, a nitrogen-containing gas or a hydrogen-containing gas. The reaction gas R may include, for example, any of $O_2$ gas, $CO_2$ gas, NO gas, $SO_2$ gas, $N_2$ gas, $H_2$ gas, and $NH_3$ gas. The precursor layer is modified by the reaction gas R so that the protective film 302 is formed, and simultaneously, the surface of the inhibitor layer IN is removed so that the film thickness of the inhibitor layer IN is reduced or removed.

After the protective film 302 is formed, the purging step is performed using an inert gas such as argon or nitrogen gas to reduce or dissipate the reaction gas R remaining in the processing chamber. In addition, the purging step may be performed by evacuating the inside of the processing chamber.

As described above, when the protective film 302 is formed using the inhibitor, the formation position or the film thickness of the protective film 302 may be further adjusted. Further, the formation position of the protective film 302 may be controlled in the same manner as described in the first embodiment. Thus, according to the second embodiment, the inhibitor is used so that the protective film 302 may be prevented from being formed on the top, and furthermore, the processing conditions are adjusted so that the protective film 302 may be prevented from being formed on the lower portion of the side wall. As a result, according to the second embodiment, it is possible to more effectively prevent the opening from being closed when the protective film is formed, in addition to the effect obtained in the first embodiment.

Figure 12A:
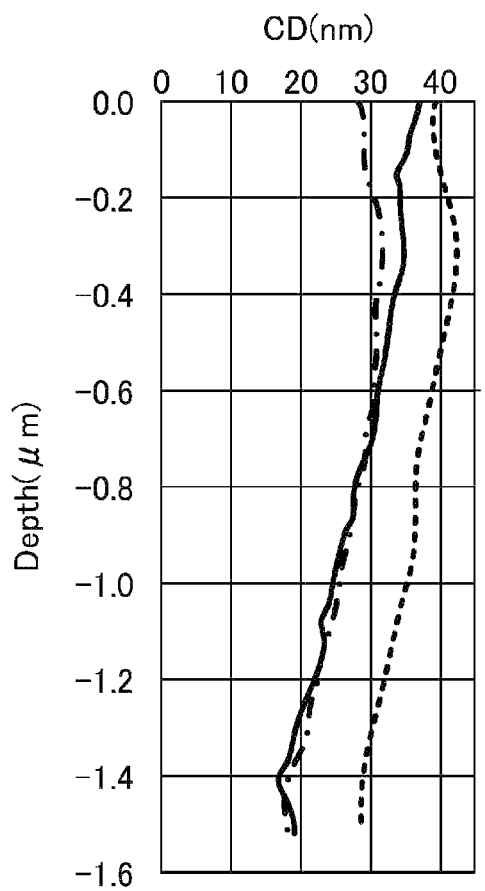
FIGS. 12A and 12B are views (first part) for explaining a suppression of closing of an opening by the substrate processing method according to the second embodiment.
Figure 12B:
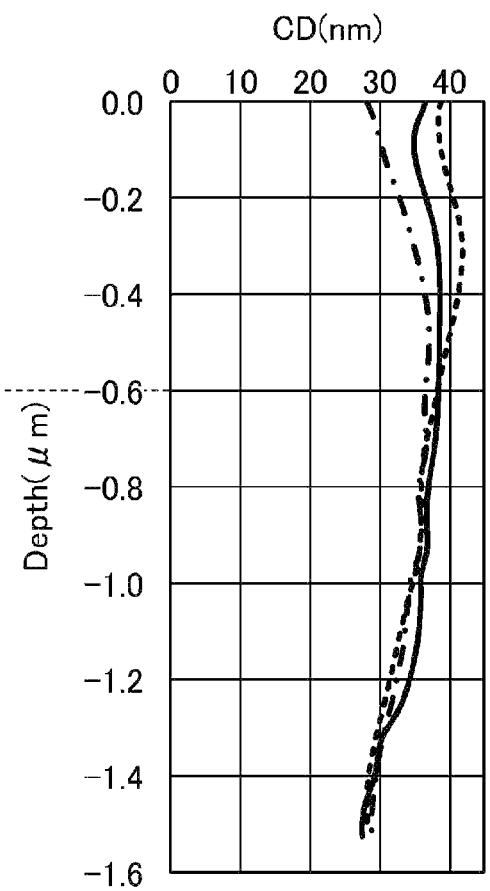

FIGS. 12A, 12B, and 13A to 13E are views for explaining the suppression of the closing of the opening by the substrate processing method according to the second embodiment. FIGS. 12A and 12B represent the CD sizes corresponding to the depth direction from the interface between the mask and the etching target film, in the pattern of the workpiece in the initial state and after the film formation. In addition, when a difference between the CD size in the initial state and the CD size after the film formation is divided by 2, the obtained value represents an amount of the film formation performed on the side wall (one side) of the pattern. In FIG. 12A, the dashed line represents the initial state of the workpiece. The alternate long and short dash line represents a result obtained when the film formation is performed on the workpiece in the initial state by the normal ALD (Reference Example 1). The solid line represents a result obtained when the inhibitor layer is formed on the workpiece in the initial state by the plasma CVD, and then, the film formation is performed by the normal ALD (Reference Example 2). In addition, in FIG. 12B, the dashed line represents the initial state of the workpiece. The alternate long and short dash line represents a result obtained when the film formation is performed on the workpiece in the initial state by the substrate processing method according to the first embodiment (Example 1). The solid line represents a result obtained when the film formation is performed on the workpiece in the initial state by the substrate processing method according to the second embodiment (Example 2).

As illustrated in FIG. 12A, when the film formation is performed by the normal ALD, the formation of the protective film to the depth of about 0.6 µm below the mask is suppressed by using the inhibitor layer. However, a substantially conformal protective film is formed at positions deeper than about 0.6 µm. Meanwhile, as illustrated in FIG. 12B, when the film formation is performed by the substrate processing method according to the second embodiment, the thickness of the protective film to the depth of about 0.6 µm below the mask is suppressed to be about one half by using the inhibitor layer, and furthermore, the formation of the protective film at positions deeper than about 0.6 µm is suppressed as in a case where the inhibitor layer is not used. In this way, the film thickness of the protective film on the top of the pattern may be more finely suppressed by using the inhibitor layer. In addition, the difference in film thickness of the protective film in the depth direction of the pattern may be maintained.

In addition, FIGS. 13A to 13E schematically represent states of an opening in the top of the mask in the initial stage, Reference Examples 1 and 2, and Examples 1 and 2 of FIGS. 12A and 12B, respectively. In the initial state, the opening dimension near the top of the mask is about 45 nanometers (nm). Meanwhile, when the film formation is performed by the normal ALD (Reference Example 1), the opening dimension is reduced to about 30 nm. Meanwhile, when the inhibitor layer is formed, and then, the film formation is performed by the normal ALD (Reference Example 2), the opening dimension is maintained at about 42 nm. Meanwhile, when the film formation is performed by the substrate processing method according to the first embodiment (Example 1), the opening dimension is about 21 nm. Meanwhile, when the inhibitor layer is formed, and then, the film formation is performed by the substrate processing method according to the second embodiment (Example 2), the opening dimension is maintained at about 40 nm. Accordingly, the effect in preventing the closing of the opening by suppressing the film formation near the top of the mask using the inhibitor layer as in the second embodiment is confirmed.

Further, in the second embodiment, the protective film may be formed at an arbitrary position by adjusting the formation position of the inhibitor layer. Accordingly, it is possible to form the protective film at a desired position while adjusting the film thickness of the protective film to respond to the shape abnormality of the pattern that is expected to occur, such as bowing or necking. Further, the position of the film formation on the side wall may be adjusted by giving the aspect dependence to the position where the inhibitor layer is to be formed. Further, by changing the composition of the inhibitor layer, both the adsorption of the precursor and the reaction of the reaction gas in the ALD may be inhibited. For example, when an inhibitor layer containing carbon is formed, the oxidation may be inhibited, and when an inhibitor layer containing CF is formed, the adsorption of the precursor may be inhibited.

Third Embodiment

In the first and second embodiments, the film formation is performed by changing the coverage in the height direction of a pattern with a high aspect ratio. However, the present embodiment may be applied not only to a pattern with a high aspect ratio but also a pattern with a low aspect ratio, for example, a pattern with an aspect ratio of less than 5. Accordingly, the embodiment applicable to the pattern with the low aspect ratio will be described as a third embodiment. In the following description, the "low aspect ratio" refers to an aspect ratio of less than 5.

FIGS. 14A to 14E are views for explaining a substrate processing method according to the third embodiment. The workpiece of FIGS. 14A to 14E includes the etching target film 102 and the mask 120 which are stacked on the substrate 101, as in the workpiece S illustrated in FIGS. 3A to 3D.

Figure 14A:
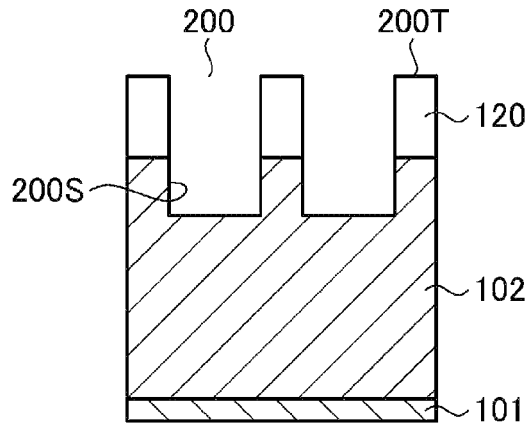
FIGS. 14A to 14E are views for explaining a substrate processing method according to a third embodiment.

First, a workpiece in which a pattern with an aspect ratio of less than 5 is formed on the etching target film 102 is prepared (FIG. 14A). At this time, the aspect ratio calculated from the upper surface of the mask 120 may be less than 5, and the aspect ratio calculated from the upper surface of the etching target film 102 may be about 1 to 2.

Figure 14B:
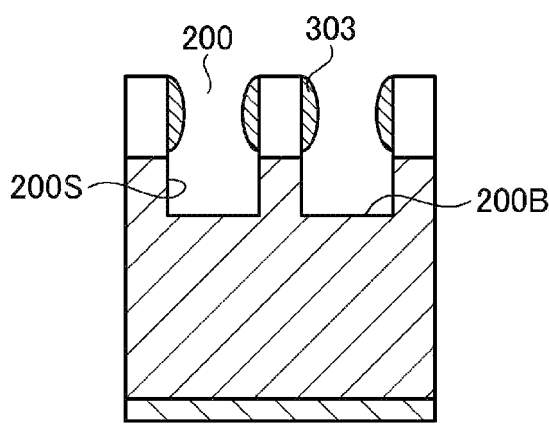

Next, a processing is performed to reduce the opening dimension of the opening 200 formed in the workpiece, that is, to narrow the width of the top 200T. For example, a preliminary film 303 is formed on the upper portion of the side wall 200S by a chemical vapor deposition (CVD) or a physical vapor deposition (PVD). The preliminary film 303 is formed using the processing condition that the preliminary film 303 is mainly formed on the upper portion of the side wall 200S, and is not formed on the lower portion of the side wall 200S and the bottom 200B (FIG. 14B).

Figure 14C:
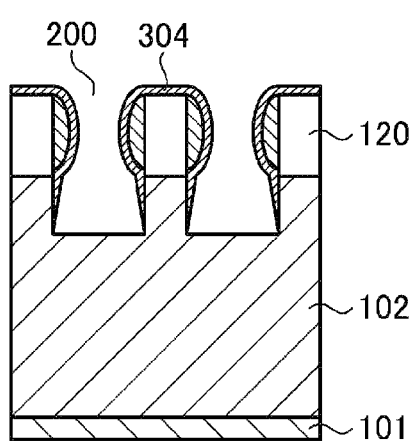

Next, as in the first embodiment, a protection film 304 is formed by the ALD using the condition that the processing is ended in a state where the adsorption of the precursor or the reaction of the reaction gas is unsaturated, that is, is not completed to the bottom surface. At this time, the protective film 304 is formed on the side wall 200S, and is not formed on the bottom 200B (FIG. 14C).

Figure 14D:
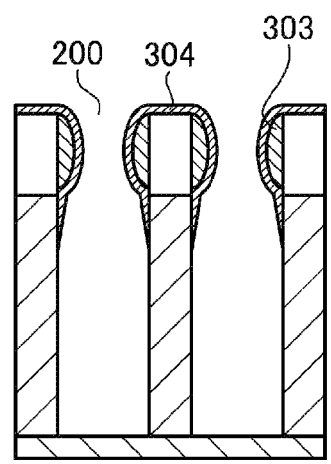

Next, the etching target film 102 is etched (FIG. 14D). When the depth dimension of the recess reaches a preset dimension or when the processing time for the etching reaches a preset processing time, the etching is ended. The timing for ending the etching may be set arbitrarily.

Figure 14E:
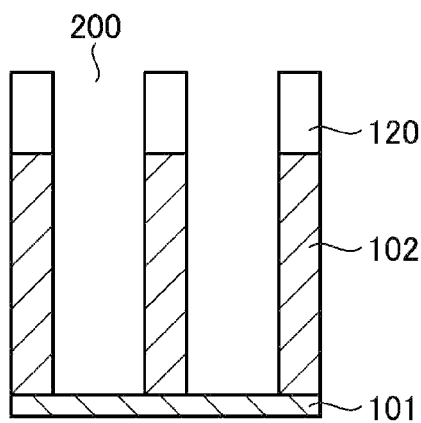

Next, the preliminary film 303 and the protective film 304 that remain on the top 200T and the upper portion of the side wall 200S are removed (FIG. 14E).

In this way, according to the substrate processing method according to the third embodiment, the etching is performed after the protective film 304 is coated to the position where the shape abnormality such as, for example, bowing occurs, that is, to the portion of the etching target film 102 immediately below the mask 120, so that the shape abnormality such as bowing may be suppressed.

Further, according to the substrate processing method according to the third embodiment, a sub-conformal ALD film may be formed on the pattern with the small aspect ratio, for example, an aspect ratio of less than 5. In the first and second embodiments, when the protective film is formed on the pattern having the high aspect ratio, the film formation amount is controlled to gradually decrease from the upper portion to the lower portion of the side wall. However, when the aspect ratio of the pattern formed on the workpiece is small, the precursor and the reaction gas reach the bottom of the recess in a short time. Thus, it is difficult to form the sub-conformal ALD film on the pattern with the low aspect ratio. Meanwhile, when the CVD or PVD is used for the pattern with the low aspect ratio, it is difficult to finely control the film thickness.

Accordingly, in the third embodiment, when the aspect ratio of the pattern formed on the workpiece is small, the processing of reducing the opening dimension of the pattern is performed in advance (FIG. 14B). With this processing, the aspect ratio of the pattern is increased, and the amounts of the precursor and the reaction gas that enter the opening are suppressed. As a result, according to the third embodiment, the sub-conformal ALD film may be formed for the pattern with the low aspect ratio as well, so that the fine control of the film thickness may be achieved.

Figure 15:
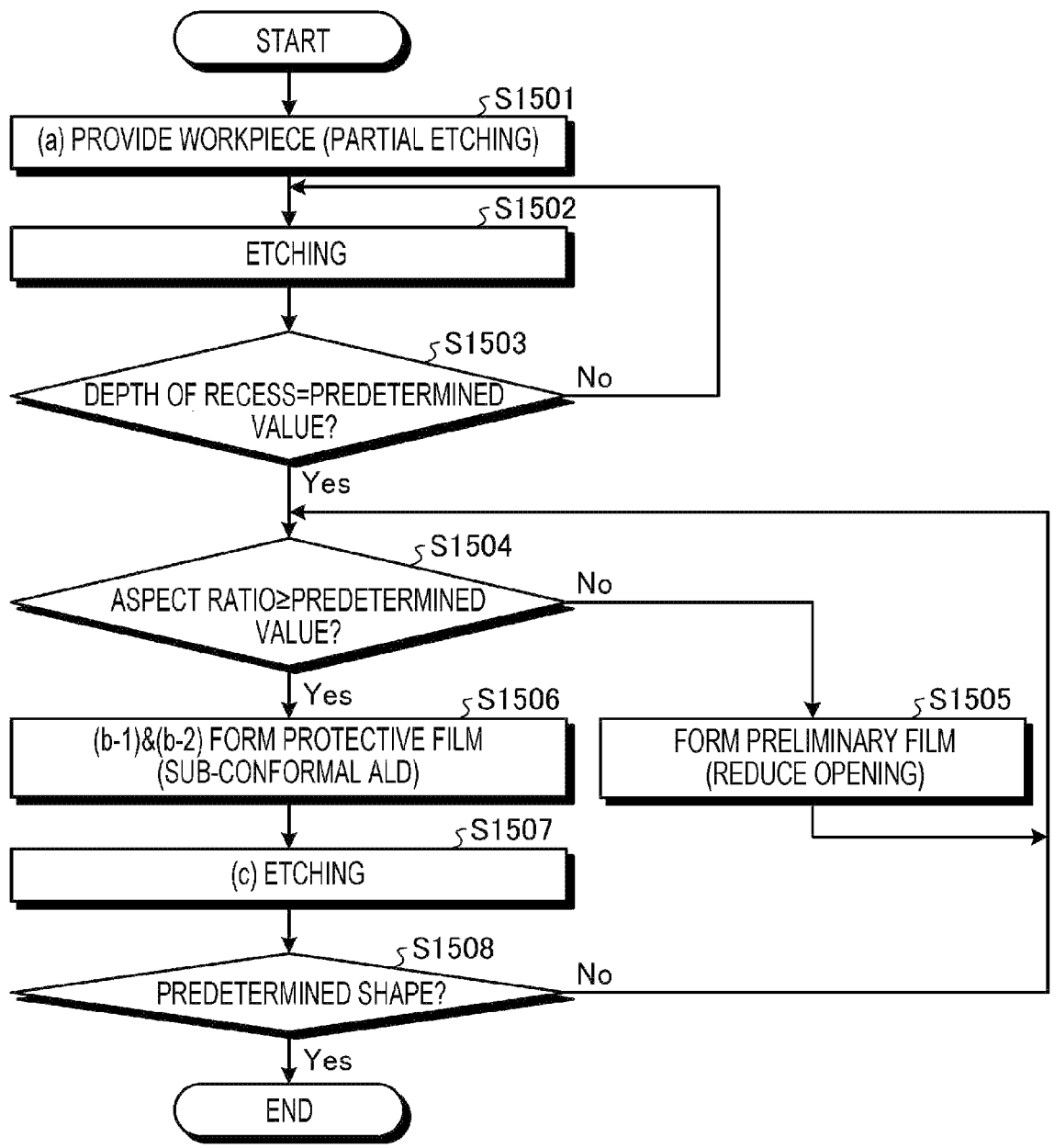
FIG. 15 is a flowchart illustrating an example of flow of the substrate processing method according to the third embodiment

FIG. 15 is a flowchart illustrating an example of flow of the substrate processing method according to the third embodiment. First, a workpiece is provided in which the mask 120 is formed on the etching target film 102, and a pattern for etching is formed on the mask 120 (step S1501). A workpiece in a state where no pattern is formed may be introduced into the chamber, and partially etched to form a pattern on the mask. Next, the etching target film 102 is etched (step S1502). It is determined whether the depth of the recess formed in the etching target film 102 after the etching reaches a predetermined value (step S1503). When it is determined that the depth of the recess does not reach the predetermined value (step S1503, No), the process returns to step S1502 to repeat the etching. Meanwhile, when it is determined that the depth of the recess reaches the predetermined value (step S1503, Yes), it is determined whether the aspect ratio of the recess is equal to or more than a predetermined value (e.g., 10) (step S1504). When it is determined that the aspect ratio of the recess is less than the predetermined value (step S1504, No), the preliminary film 303 is formed to narrow the width of the opening 200 (step S1505). Then, the process returns to step S1504. Meanwhile, when it is determined that the aspect ratio of the recess is equal to or more than the predetermined value (step S1504, Yes), the protection film 304 is formed (step S1506). The processing for forming the protective film 304 is the same as the processing for forming the protective film in the first embodiment. For example, the protective film 304 may be formed by performing steps S101 to S105 in FIG. 1. After the protective film 304 is formed, the etching is performed again (step S1507). Then, it is determined whether the workpiece has a predetermined shape (step S1508). For example, it is determined whether the depth of the recess formed in the etching target film 102 by the etching has reached a predetermined depth. Then, when it is determined that the workpiece does not have the predetermined shape (step S1508, No), the process returns to step S1504 to repeat the processing. Meanwhile, when it is determined that the workpiece has the predetermined shape (step S1508, Yes), the process is ended. In this way, the substrate processing method according to the third embodiment is ended.

As described above, in the third embodiment, the protective film may be formed by the sub-conformal ALD even for the pattern with the low aspect ratio, by performing the processing of narrowing the opening in advance thereby increasing the aspect ratio.

Further, in the third embodiment, the "low aspect ratio" is defined to be the aspect ratio of less than 5, and the process according to the third embodiment is applied to the pattern with the low aspect ratio. However, even when a pattern has an aspect ratio of 5 or more, it may be difficult to implement the sub-conformal film formation as long as the aspect ratio is less than 10. Thus, the method of the third embodiment may be applied to a pattern with an aspect ratio of 5 to 10.

In addition, the preliminary film 303 is preferably formed of a material that may be removed in a subsequent processing. For example, the preliminary film 303 is formed of $SiO_2$, SiN, SiC or the like. When the preliminary film 303 is formed of $SiO_2$, an aminosilane-based gas, $SiCl_4$, $SiF_4$ or the like may be used as the precursor. In addition, when the preliminary film 303 is formed of SiN, an aminosilane-based gas, $SiCl_4$, DCS, HCDS or the like may be used as the precursor. Further, for example, the preliminary film 303 may be an organic film such as a carbon-containing film, or a metal film containing titanium (Ti) or tungsten (W).

(Modification 1—Change of Processing Conditions according to Mask Thickness)

Figure 16:
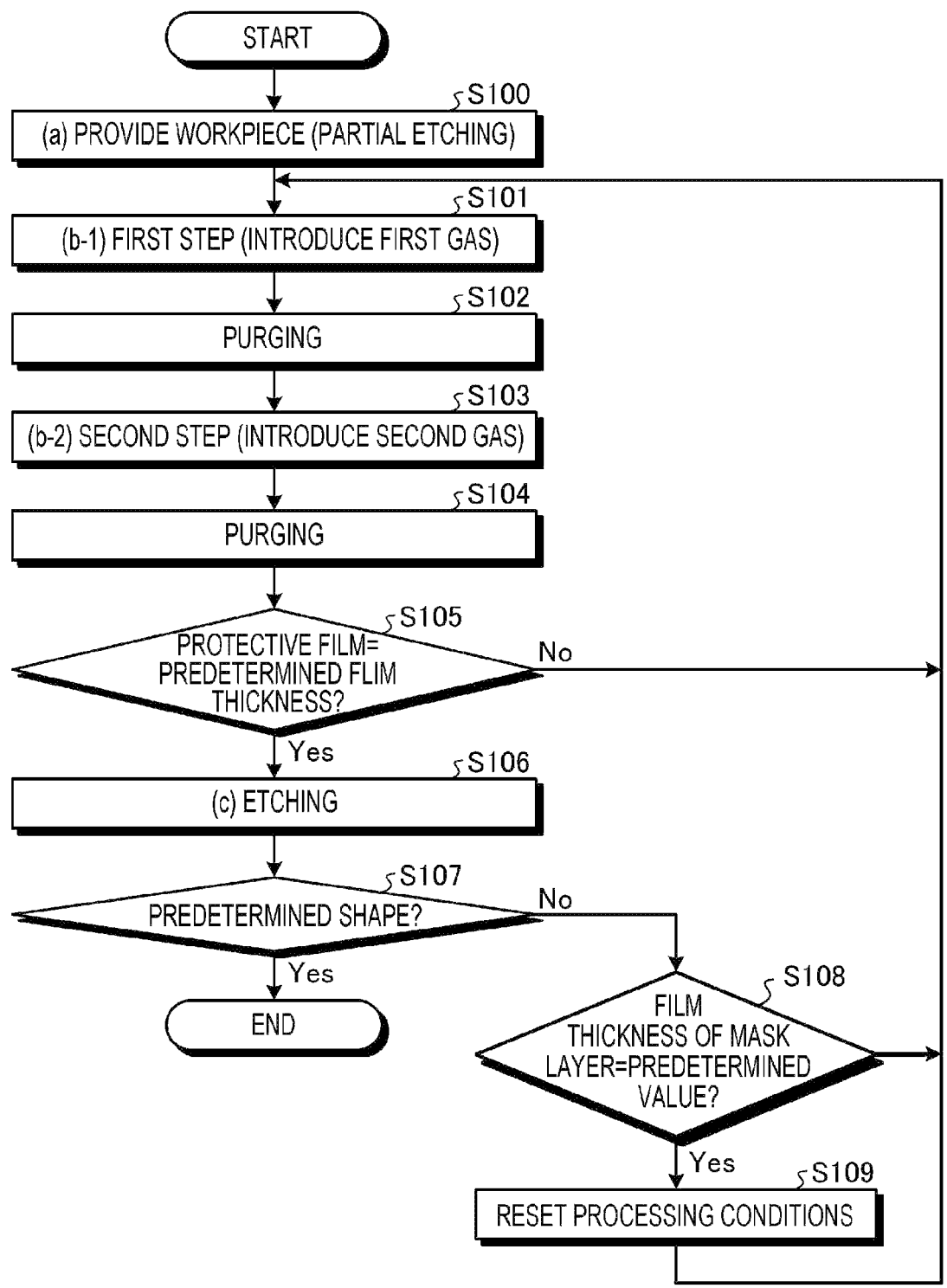
FIG. 16 is a flowchart illustrating an example of flow of a substrate processing method according to Modification 1.

The first and second embodiments have been described. Each of the embodiments may be further modified. FIG. 16 is a flowchart illustrating an example of flow of a substrate processing method according to Modification 1. FIGS. 17A to 17D are views for explaining an example of a workpiece processed by the substrate processing method according to Modification 1. Modification 1 copes with a decrease of the film thickness of the mask in the process of processing the workpiece based on the methods of the first and second embodiments.

Figure 17:
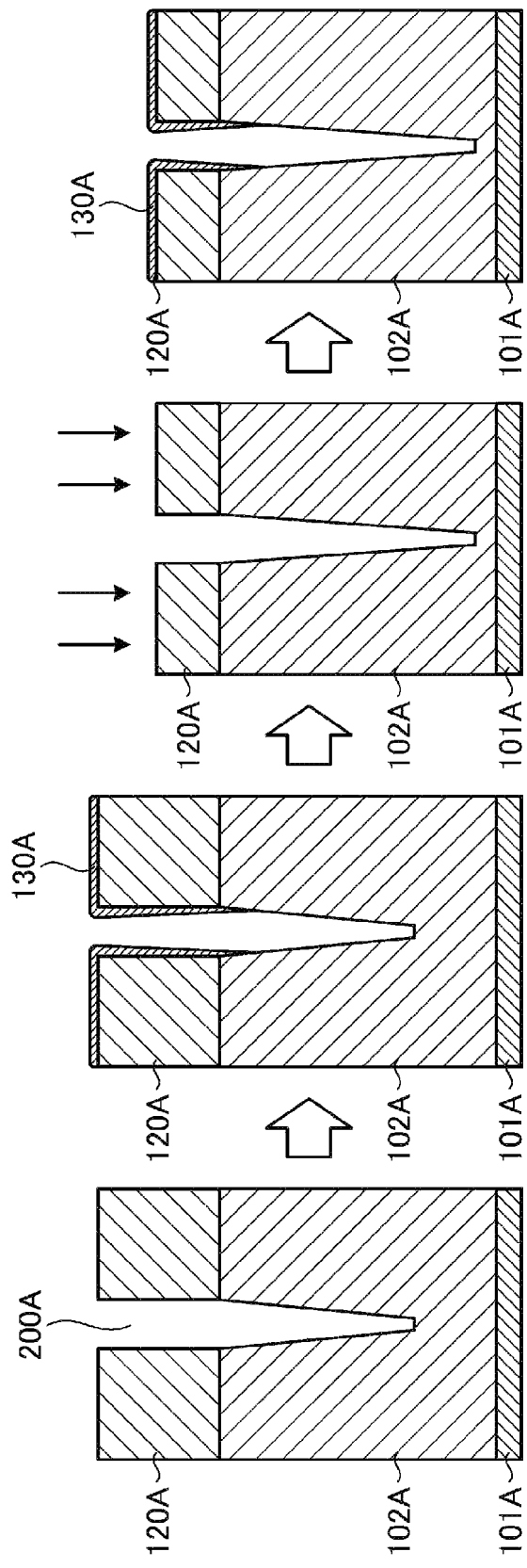
FIGS. 17A to 17D are views for explaining an example of a workpiece processed by the substrate processing method according to Modification 1.

A workpiece S1 illustrated in FIG. 17A has the same shape as the workpiece S illustrated in FIGS. 2A to 2D. In the substrate processing method according to Modification 1, the process from providing the workpiece S1 (step S100) to performing the etching (step S106) is the same as that in the first embodiment. By the process from step S100 to step S106, for example, the workpiece S1 illustrated in FIG. 17B is formed. As for the workpiece S1, an etching target film 102A and a mask 120A are formed on a substrate 101A. Further, a recess having an opening 200A is formed in the etching target film 102A and the mask 120A. A protective film 130A is formed on the top of the recess and the upper portion of the side wall. The protective film 130A is formed to the position immediately below the mask 120A where the shape abnormality may easily occur due to the etching. Further, the inner wall of the protective film 130A is shaved by the etching. When steps S101 to S106 are repeated again from the state represented in FIG. 17B, the top of the mask 120A is gradually shaved, and the distance from the top of the mask 120A to the upper surface of the etching target film 102A changes (FIG. 17C). In this case, when the protective film 130A is formed without changing the processing conditions of the first and second steps, the position where the protective film 130A is formed becomes lower than the position immediately below the mask 120A where the shape abnormality occurs.

Accordingly, in Modification 1, after the etching (step S106) and step S107 are performed, it is determined whether the film thickness of the mask 120A is a predetermined value (step S108). The determination of whether the film thickness of the mask 120A is the predetermined value may be performed based on the film thickness of the mask 120A before the workpiece S1 is processed and the number of times that steps S101 to S106 are performed. In addition, the determination of whether the film thickness of the mask 120A is the predetermined value may be performed based on a measured value of the film thickness. In addition, the method of measuring the film thickness is not particularly limited, and the film thickness may be measured by, for example, an optical method. Then, when it is determined that the film thickness of the mask 120A is the predetermined value (step S108, Yes), the processing conditions of the first step or the second step are reset (step S109). For example, when the processing conditions are set to change the coverage in the first step along the depth direction of the pattern, the processing conditions are changed to cause the first gas to be adsorbed to the further upper portion of the pattern. For example, the processing time for the next first step is set to be shorter than the processing time for the previous first step. In addition, for example, when the processing conditions are set to change the coverage in the second step along the depth direction of the pattern, the processing conditions are changed to cause the second gas to react only at the further upper portion of the pattern. For example, the temperature of the processing chamber is set to be low. Meanwhile, when it is determined that the film thickness of the mask 120A is not the predetermined value (step S108, No), the process returns to step S101 without changing the processing conditions.

As described above, by adjusting the processing conditions according to the film thickness of the mask 120A, the protective film 130A may be selectively formed at the position where the shape abnormality may easily occur. For example, in the workpiece of FIG. 17C, the film thickness of the mask 120A becomes about half that at the start time of the processing, and thus, the distance from the top to the etching target film 102A is short. In this case, the processing conditions are changed to reduce the distance in the depth direction in which the protective film 130A is formed. Then, as illustrated in FIG. 17D, the protective film 130A may be continuously formed at the position immediately below the mask 120A where the shape abnormality may easily occur.

In addition, even when bowing occurs in the etching target film 102A, the pattern shape may be corrected by updating the processing conditions and performing steps S101 to S104.

As described above, when the aspect ratio of the recess having the opening 200A increases due to the etching (step S106) performed after the first and second steps, the processing conditions may be changed. For example, the processing conditions of at least one of the first step (step b-1) and the second step (step b-2) may be changed according to the increase of the aspect ratio. For example, the transport amount of radicals generated in the second step may be increased. That is, the processing conditions may be changed such that as the number of times of etching (step S106) increases, the protective film 130A is formed on the further upper portion of the etching target film 102A. In addition, the processing conditions may be changed each time the first and seconds steps are repeated, or may be changed after the first and second steps are repeated several times. In addition, the processing conditions may be appropriately changed according to factors other than the film thickness of the mask.

Fourth Embodiment

As described in the first embodiment, in a case where a recess is formed to have a diameter that is reduced from the top toward the bottom, a control may be implemented to increase the dimension of the bottom while suppressing the change of the dimension of the side wall by the protective film. The control of the dimension of the recess will be further described as a fourth embodiment. According to a substrate processing method of the fourth embodiment, the degree of freedom in controlling the shape of the pattern to be formed may be improved.

Figure 18:
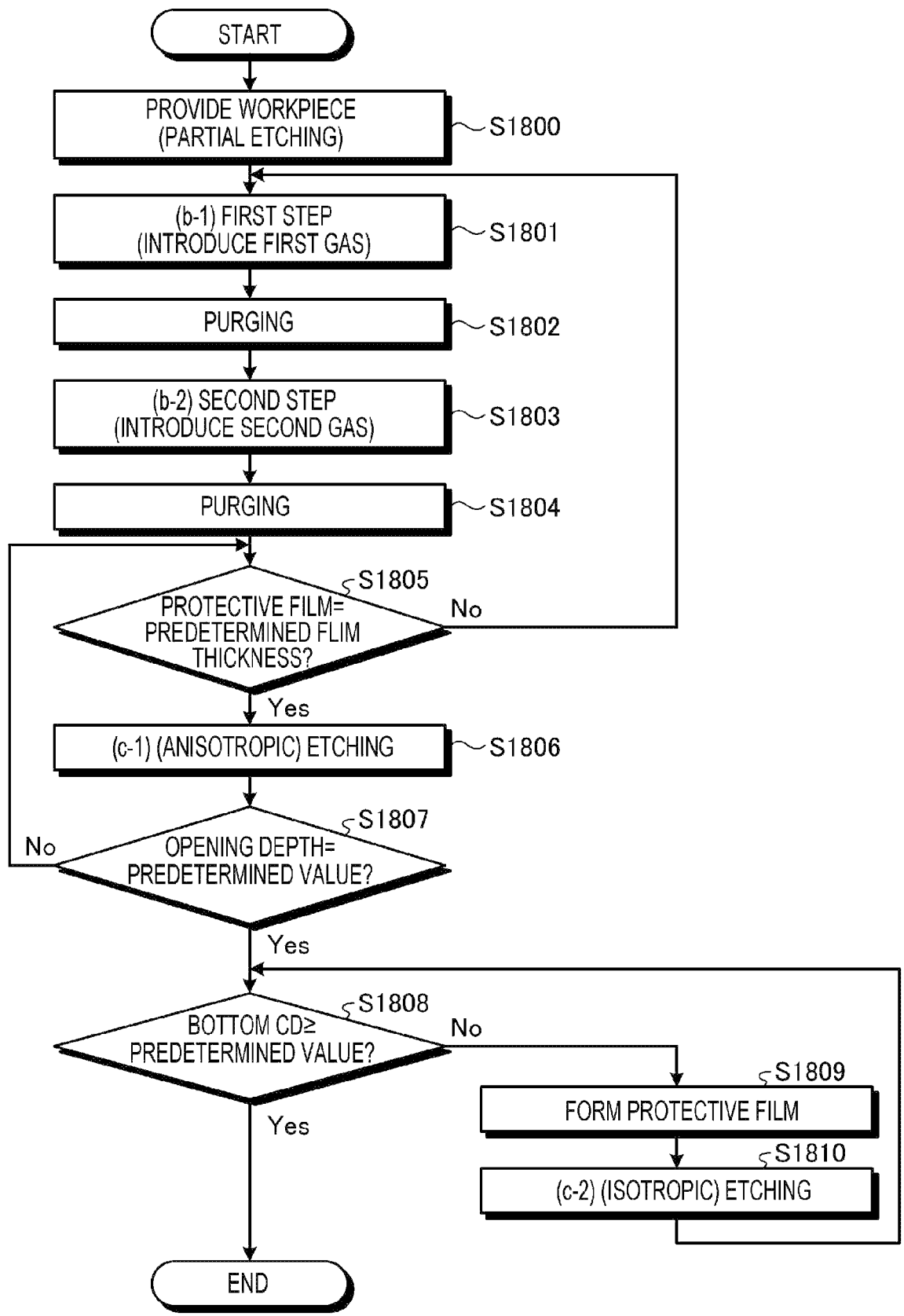
FIG. 18 is a flowchart illustrating an example of a flow of a substrate processing method according to a fourth embodiment.

FIG. 18 is a flowchart illustrating an example of a flow of the substrate processing method according to the fourth embodiment. FIGS. 19A to 19D and 20A to 20D are views illustrating an example of a workpiece processed by the substrate processing method according to the fourth embodiment.

First, a workpiece S2 (see FIG. 19A) is provided (step S1800). The workpiece S2 includes a substrate 101B, an etching target film 102B formed on the substrate 101B, and a mask 120B (see FIG. 19A). The mask 120B has an opening 200A'. The opening 200A' has a bottom 201 and a side wall 202. The bottom 201 of the opening 200' reaches the etching target film 102B. In step S1800, the etching target film 102B is partially etched via the mask 120B.

Next, as in the first embodiment, the protective film 130A is formed by the first step (step S1801), the purging (step S1802), the second step (step S1803), and the purging (step S1804) (see FIGS. 17A to 17D). Then, when it is determined that the protective film 130A has a predetermined film thickness (step S1805, Yes), the workpiece S2 is etched (step S1806). Meanwhile, when it is determined that the protective film 130A does not have the predetermined film thickness (step S1805, No), the process returns to step S1801 to repeat the processing. Steps S1801 to S1806 are the same as steps S101 to S106 in FIG. 16, and the purging in each of steps S1802 and S1804 may be omitted. Further, in the present embodiment, steps S1801 to S1804 may be omitted in a case where the bowing described in the first embodiment does not occur or the influence of the bowing is small when the workpiece S2 is etched in steps S1806.

Next, it is determined whether the depth of the opening 200A' formed in the workpiece S2 reaches a predetermined value (step S1807). For example, it is determined whether the depth of the opening 200A' reaches the position of the upper surface of the substrate 101B. When it is determined that the depth of the opening 200A' does not reach the position of the upper surface of the substrate 101B (step S1807, No), the process returns to step S1805 to repeat the processing. Meanwhile, when it is determined that the depth of the opening 200A' reaches the position of the upper surface of the substrate 101B (step S1807, Yes), it is determined whether the opening dimension of the bottom 201 is equal to or larger than a predetermined value (step S1808). The opening dimension of the bottom 201 refers to a horizontal dimension of the bottom 201. Hereinafter, the horizontal dimension of the bottom 201 may also be referred to as a bottom CD (critical dimension). The "predetermined value" in each of steps S1807 and S1808 is set in advance based on, for example, a design of an apparatus.

Here, it is assumed that the opening 200A' has an ideal shape in which the side wall 202 extends vertically from the top to the bottom 201. Further, it is assumed that the "predetermined value" in step S1808 is set as the bottom CD of the ideal shape. Further, it is assumed that the tapered opening 200A' illustrated in FIG. 19B is formed. In this case, in step S1808, it is determined that the bottom CD is less than the predetermined value (step S1808, No). When it is determined that the bottom CD is less than the predetermined value, the protective film 130B is formed (step S1809, see FIG. 19C). The protective film 130B is formed on the top 203 and the side wall 202 of the opening 200A'. In the example of FIG. 19C, the protective film 130B is formed to have a film thickness that gradually decreases from the upper portion toward the lower portion of the side wall 202. As a method of forming the protective film 130B, the sub-conformal ALD that is used for forming the protective film 130A (see FIGS. 17A to 17D) and others may be used, or the plasma CVD (PECVD) may be used. When the PECVD is used, for example, $SiCl_4$, $O_2$ and a rare gas may be used as the processing gas. As the rare gas, for example, Ar, He, and Kr may be used. Further, the pressure in the chamber may be 10 mTorr to 1 Torr, and the radio frequency (RF) power may be 50 W or more.

Next, the workpiece S2 on which the protective film 103B is formed is etched (trimmed) (step S1810). At this time, the portion of the side wall 202 that is covered with the protective film 130B is not etched, and the lower portion of the side wall 202 that is not covered with the protective film 130B or has the thinner film thickness of the protective film 130B than that in the upper portion has the larger width than that of the upper portion as a result of the etching (see FIG. 19D). After the etching in step S1801, the process returns to step S1808.

In step S1808, when it is determined that the bottom CD is equal to or more than the predetermined value (step S1808, Yes), for example, when the predetermined value in step S1808 is set to be substantially identical to the dimension of the top of the opening, the shape of the workpiece S2 at the time when the process is ended becomes, for example, the shape illustrated in FIG. 19D.

The etching of step S1806 and the etching of step S1810 are performed under different processing conditions. In the etching of step S1806, processing conditions are set such that the opening 200A' is dug mainly in the depth direction. Meanwhile, in the etching of step S1810, processing conditions are set such that the bottom 201 of the opening 200A' is expanded in the horizontal direction. For example, the processing conditions in step S1806 are set to implement an anisotropic etching, and the processing conditions in step S1810 are set to implement an isotropic etching. The processing of step S1810 may be implemented using, for example, COR (chemical oxide removal) which is a method according to Modification 3 to be described later, instead of the etching.

For example, when the etching target film 102B is a silicon oxide film ($SiO_2$), a fluorocarbon (CF)-based etching gas is used in the etching of step S1806. For example, $C_4F_6$, $C_4F_8$ or the like may be used. In addition, a mixture of a CF-based gas, argon (Ar) gas, and oxygen ($O_2$) gas may be used. In addition, a hydrofluorocarbon (CHF)-based etching gas such as $CH_3F$, $CH_2F_2$ and $CHF_3$ may be added. Meanwhile, in the etching of step S1810, a fluorine-containing gas may be used as the etching gas. For example, $NF_3$ may be used.

Further, for example, when the etching target film 102B is an organic film, an oxygen-containing gas may be used in the etching of step S1806. For example, $O_2$, CO, $CO_2$ or the like may be used as the etching gas. In this case, an oxygen-containing gas may also be used as the etching gas in step S1810.

In addition, as for the other processing conditions than the processing gas, it is preferable that the pressure of the chamber in the processing of step S1806 is about 10 mTorr to 30 mTorr, and the pressure of the chamber in the processing of step S1810 is 100 mTorr or more. Further, the radio frequency (RF) voltage applied for bias generation at the time of generating plasma is set to be higher in the processing of step S1806 than that in the processing of step S1810.

In addition, when the method of Modification 3 is used in step S1810, a mixed gas of a fluorine-containing gas and $NH_3$ or a mixed gas of $N_2$ and $H_2$ may be used. As the fluorine-containing gas, $NF_3$, $SF_6$ or a CF-based gas may be used.

As described above, in the substrate processing method according to the fourth embodiment, after an opening having a desired depth is formed, a film having a thickness that differs along the depth direction of the opening is formed, and the workpiece is etched. Thus, the dimension of the lower portion of the opening that is not covered with the film may be expanded in the horizontal direction, and the dimension of the opening may be adjusted. As a result, according to the fourth embodiment, it is possible to more finely suppress the shape abnormality of the pattern in the etching target film.

In addition, the substrate processing method according to the fourth embodiment may be performed not only after the bottom 201 of the opening 200A' reaches the position of the upper surface of the substrate 101B, but also during the etching of the etching target film 102B. FIGS. 20A to 20D illustrate an example where the substrate processing method according to the fourth embodiment is applied during the etching of the etching target film 102B.

The workpiece S2 illustrated in FIG. 20A is the same as the workpiece S2 illustrated in FIG. 19A. The shape represented in FIG. 20B may be obtained in the middle of the step of digging the opening 200A' starting from the state of FIG. 19A until the opening 200A' becomes the state of FIG. 19B. For example, the "predetermined value" in step S1807 of FIG. 18 is set to a depth that does not reach the substrate 101B. Then, step S1808 is performed in a step where the bottom 201 of the opening 200A' is positioned inside the etching target film 102B. Further, step S1808 is performed based on, for example, the performance time of steps S1800 and S1806, in the step where the bottom 201 of the opening 200A' is positioned inside the etching target film 102B. Then, the formation of the protective film in step S1809 (see FIG. 20C) and the etching in step S1810 (see FIG. 20D) are performed in the state represented in FIG. 20B. By altering the determination process in this way, the process of expanding the bottom CD may be started from the state represented in FIG. 20B. As a result, the shape of the opening 200A' may be adjusted while suppressing the damage to the substrate 101B.

As described above, in the substrate processing method according to the fourth embodiment, the protective film 130B may be formed from the time when the bottom 201 of the opening 200A' is positioned inside the etching target film 102B. Thus, according to the fourth embodiment, the reduction of the bottom CD may be suppressed, and further, the occurrence of bowing may be suppressed.

(Determination of Bottom CD)

The determination method in step S1808 is not limited. For example, the bottom CD may be determined by inspecting the shape of the workpiece S2 using optical means or the like. In addition, the bottom CD may be determined based on the number of times of performing steps S1801 to S1804 and S1806 or the performance time of the steps. In addition, when step S1810 is performed, the bottom CD may be determined based on the performance time of step S1810. The "predetermined value" in step S1808 is set in advance based on a design value.

(Determination of Whether to Form Protective Film)

In addition, it may be determined whether to form the protective film (step S1809), before step S1809. The determination method is not particularly limited. For example, it may be determined whether to form the protective film 130B, according to the thickness and/or the position of the protective film 130B remaining on the side wall 202. Further, it may be determined whether to form the protective film 130B, according to, for example, the number of times of performing steps S1801 to S1804 and S1806 or the performance time of the steps. In addition, when the protective film formed in steps S1801 to S1804 (130A in FIGS. 17A to 17D) remains, it may be determined whether to perform step S1809, according to the thickness and/or the position of the protective film.

The determination in step S1808 and the determination of whether to form the protective film may be performed collectively. For example, the process may be ended when the number of times of performing steps S1801 to S1804 and S1806 reaches a value V1. Further, when the number of times of performing steps S1801 to S1804 and S1806 does not reach a value V2 (V2<V1), the protective film 130B may be formed. In addition, when the number of times of performing steps S1801 to S1804 and S1806 does not reach a value V3 (V3<V2), the etching (S1810) may be performed without forming the protective film 130B.

(Film Types)

The type of each of the etching target film 102B, the mask 120B, and the protective film 130B is not particularly limited. For example, the substrate 101B may be a silicon wafer. The etching target film 102B may be a dielectric film, for example, a silicon-containing dielectric film. The etching target film 102B may be formed by stacking a plurality of types of films. For example, the etching target film 102B may be a layer in which a silicon oxide film and a silicon nitride film are stacked in an order. The etching target film 102B may be a layer in which a silicon oxide film and a polysilicon film are stacked in an order. The mask 120B may be a carbon-containing film. The carbon-containing film may be formed of an amorphous carbon layer (ACL) or a spin-on carbon film (SOC). Alternatively, the mask 120B may be formed of a metal film. In addition, although not illustrated in FIGS. 19A to 19D and 20A to 20D, a silicon oxynitride film (SiON) or a back surface antireflection film (BARC) having the same opening pattern as that of the mask 120B may be present on the mask 120B. The protective film 130B may be a silicon-containing film. In addition, the film types of the mask 120B and the etching target film 102B may be the same.

In the substrate processing method according to the fourth embodiment, when the etching target film 102B is a silicon-containing dielectric film, the mask 120B may be a carbon-containing film such as ACL and SOC. In addition, when the etching target film 102B is a polysilicon film, the mask 120B may be, for example, a silicon oxide film formed using TEOS (tetraethoxysilane).

In the substrate processing method according to the fourth embodiment, plasma may or may not be used for forming the protective film in step S1809 and performing the etching in step S1810.

In addition, the substrate processing method according to the fourth embodiment may be applied to not only a pattern with a high aspect ratio but also patterns with various aspect ratios including a low aspect ratio. The substrate processing method according to the fourth embodiment may be preferably applied to, for example, a pattern with an aspect ratio of 10 to 20.

(Modification 2—Adjustment of Film Thickness in Wafer Plane)

In the first embodiment, the coverage and the film thickness of the protective film are adjusted by adjusting the processing conditions. Meanwhile, the processing conditions in the first and second steps may be adjusted from the following two viewpoints.

(1) The position of the film formation in the depth direction of the pattern is controlled by controlling the introduction amount of the precursor or reaction gas.

(2) The film thickness of the protective film to be formed is controlled.

In the first and second embodiments, the position of the film formation is controlled mainly from the viewpoint (1). Modification 2 adjusts the processing conditions from the viewpoint (2). FIGS. 21A and 21B are views for explaining a relationship between the temperature of the workpiece and the film formation amount. A wafer processed in a substrate processing apparatus has, for example, a disk shape with a diameter of about 300 mm. It is known that when a film formation processing is performed on the wafer, the film formation amount varies according to the temperature of the wafer. FIG. 21A represents the relationship between the temperature of the wafer and the film formation amount. As represented in FIG. 21A, when the temperature of the wafer increases, the film formation amount increases, and when the temperature of the wafer decreases, the film formation amount decreases.

In Modification 2, the stage of the wafer (electrostatic chuck) is divided into a plurality of concentric zones such that the temperature of each zone may be independently controlled. Accordingly, the film thickness of the protective film to be formed at an arbitrary position may be controlled to be a desired thickness. For example, it is known that during a processing such as etching, the shape abnormality (e.g., bowing) is small at the center of the wafer and large at the edge of the wafer. In this case, the temperature of the center where the shape abnormality tends to be small is controlled to be lower than the temperature of the edge where the shape abnormality tends to be large. With this control, the film thickness of the protective film to be formed may be adjusted according to the radial position of the wafer, and the in-plane uniformity of the dimension of an opening to be formed may be improved.

In addition, for the control of the film thickness, when the plurality of zones divided in the radial direction and in the circumferential direction are formed such that the temperature of each zone may be independently controlled as illustrated in FIG. 21B, the temperature control may be used, in addition to the improvement of the in-plane uniformity. For example, it is possible to implement a processing of forming openings having different shapes by changing the thickness of a protective film to be formed on each position of the wafer.

(Modification 3—Removal of Oxide Film)

When semiconductor devices are manufactured, a natural oxide film may be formed on a wafer W. The natural oxide film may be removed, and in that case, other peripheral films may be removed or damaged. Thus, it is preferable to remove the natural oxide film without damaging the peripheral films. The substrate processing method according to the present embodiment may change the film formation amount in the depth direction of the pattern. Thus, it is possible to suppress the damage to the peripheral films when the natural oxide film is removed, by not forming a protective film on the oxide film formed on the bottom of the recess and by forming a protective film on other portions.

FIGS. 22A to 22C are views for explaining an example of a workpiece processed by a substrate processing method according to Modification 3. FIG. 22A is a view illustrating an example of a workpiece on which an oxide film is formed. As for the workpiece (e.g., a semiconductor wafer W), a $SiO_2$ film 140 is formed on a silicon (Si) layer 101C that serves as a base. A pattern is formed on the $SiO_2$ film 140. In FIGS. 22A to 22C, a recess is formed as a pattern in the $SiO_2$ film 140 to reach the Si layer 101C. In the workpiece, the upper surface of the $SiO_2$ film 140 and the side wall of the recess are covered with a SiN film 150. Further, in the wafer W, a natural oxide film 160 ($SiO_2$) is formed on the Si layer 101C of the bottom of the recess. Since the portion of the natural oxide film 160 that corresponds to the bottom of the recess is shifted to silicon germanium or the like, the Si layer 101C is represented in a different pattern.

In the substrate processing method according to Modification 3, the protective film 300C of which film thickness becomes thin in the depth direction is formed on the side wall of the recess, by using steps S101 to S104 of the first embodiment. In the substrate processing method according to the first embodiment, the film formation is not performed on the bottom of the recess, and is performed on the side wall and the top. As a result, the protective film 300C illustrated in FIG. 22B may be formed. Then, an etching is performed after the protective film 300C is formed. Since the protective film 300C covers the side wall, the SiN film 150 below the protective film 300C may be suppressed from being damaged, and the natural oxide film 160 on the bottom and the protective film 300C on the side wall may be removed. As a result, the workpiece illustrated in FIG. 22C is obtained.

As described above, when the protective film 300C is formed using the sub-conformal ALD, the film is not formed on the bottom of the recess and is formed on the side wall and the top of the recess, so that the natural oxide film 160 may be removed without lowering the etching rate of the bottom of the recess. Further, by forming the protective film 300C on the side wall of the recess, the damage to the $SiO_2$ film 140 or the SiN film 150 may be suppressed.

In the embodiments described above, an example where the protective film is used to suppress the occurrence of the shape abnormality of a semiconductor pattern has been described. The present disclosure is not limited thereto, and the substrate processing method according to the embodiments may be used to correct the shape abnormality when the shape abnormality occurs in a mask during a formation of a pattern.

(Conditioning in Chamber)

In the embodiments described above, for example, the film formation in steps S101 to S104 of FIG. 1 and the etching in step S106 of FIG. 1 may be performed in one chamber. In this case, by-products generated by the etching may adhere to the inside of the chamber, and may affect the conditions for the film formation. Meanwhile, when only a processing of forming the same film is performed in one chamber, the same film as the film formed on the workpiece is additionally formed on the inner wall of the chamber and the surfaces of other components. Thus, the state of a film formed by a film formation may differ between a case where only the film formation is performed in one chamber and a case where both the film formation and the etching are performed in one chamber.

Accordingly, after the etching of the present embodiment (e.g., step S106 in FIG. 1) is performed, conditioning of the surface exposed to the plasma space in the chamber may be performed. As the conditioning, (1) cleaning in the chamber and (2) coating in the chamber may be performed.

The cleaning in the chamber is performed by, for example, turning a predetermined cleaning gas into plasma in the chamber, and then, discharging the plasma. As the cleaning gas, an oxygen-containing gas such as $O_2$ or $CO_2$, or a hydrogen-containing gas such as $H_2$ or $NH_3$ may be used. In addition, the cleaning method is not particularly limited. The cleaning in the chamber is performed under, for example, a condition that carbon or fluorine adhering onto the outermost surface (the inner surface of the chamber) is removed.

In addition, the coating in the chamber is performed by turning a predetermined coating gas into plasma in the chamber, and then, discharging the plasma. As for the coating gas, a silicon oxide film $SiO_2$ or the like may be formed by the CVD or ALD using a silicon-containing gas such as $SiCl_4$ or an aminosilane-based gas, or an oxygen-containing gas such as $O_2$. The coating method is not particularly limited. Further, the material used for the coating is not also particularly limited. The coating is performed, for example, after a plasma processing using fluorine (e.g., CF) is performed. With the coating, by-products exposed to the uppermost surface of the chamber are covered and prevented from being exposed to the plasma processing space.

In addition, the cleaning and the coating for the conditioning are performed under the condition that not only the periphery of the stage on which the workpiece is disposed but also the entire inner wall of the chamber are processing targets. In addition, the cleaning and the coating for the conditioning may be performed for every plasma processing, or may be performed each time the plasma processing is performed a predetermined number of times. As a result, the inner surface to which by-products adhere is prevented from being exposed to the plasma processing space. Thus, the condition and the state in the chamber are prevented from being changed for each processing, so that the state of the film to be formed may be stabilized.

(Other Modifications)

In the embodiment described above, the first and second steps may be set as one cycle, and the cycle may be repeated an arbitrary number of times. Further, in the embodiment described above, the film formed by the ALD has been described as an example of the film having the self-controllability. However, the present disclosure is not limited thereto, and for example, a self-assembled monolayer (SAM) may be used as the protective film.

Example of Substrate Processing Apparatus according to Embodiment

Figure 23:
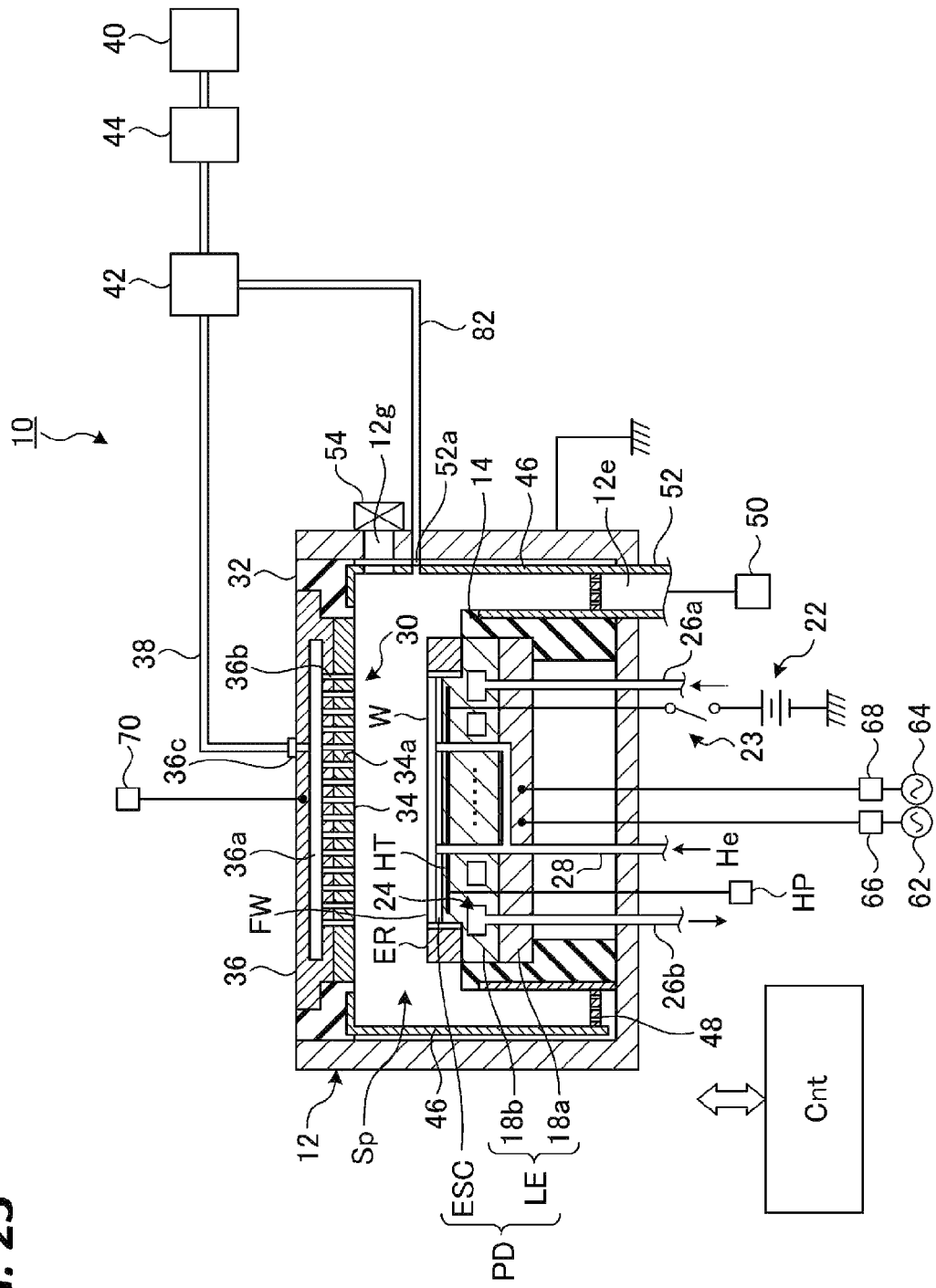
FIG. 23 is a view illustrating an example of a substrate processing apparatus according to the first embodiment.

FIG. 23 is a view illustrating an example of a substrate processing apparatus according to an embodiment, which is used for performing the substrate processing method according to the embodiment described above. FIG. 23 schematically illustrates a cross-sectional structure of a substrate processing apparatus 10 which is usable in the various embodiments of the substrate processing method according to the embodiment described above. As illustrated in FIG. 23, the substrate processing apparatus 10 is a plasma etching apparatus provided with parallel plate electrodes, and includes a processing container 12. The processing container 12 has a substantially cylindrical shape, and defines a processing space Sp. The processing container 12 is made of, for example, aluminum, and an inner wall surface of the processing container 12 is anodized. The processing container 12 is grounded for security.

A substantially cylindrical support 14 is provided on the bottom of the processing container 12. The support 14 is made of, for example, an insulating material. The insulating material of the support 14 may include oxygen like quartz. The support 14 extends vertically from the bottom of the processing container 12 in the processing container 12. A stage PD is provided inside the processing container 12. The stage PD is supported by the support 14.

The stage PD holds a wafer W on the top surface thereof. The main surface FW of the wafer W is present on the opposite side of the back surface of the wafer W in contact with the top surface of the stage PD, and faces an upper electrode 30. The stage PD includes a lower electrode LE and an electrostatic chuck ESC. The lower electrode LE includes a first plate 18a and a second plate 18b. The first plate 18a and the second plate 18b are formed of, for example, a metal such as aluminum, and has a substantially disk shape. The second plate 18b is provided on the first plate 18a, and electrically connected to the first plate 18a.

The electrostatic chuck ESC is provided on the second plate 18b. The electrostatic chuck ESC has a structure in which an electrode serving as a conductive film is disposed between a pair of insulating layers or between a pair of insulating sheets. A DC power supply 22 is electrically connected to the electrode of the electrostatic chuck ESC via a switch 23. When the wafer W is disposed on the stage PD, the wafer W comes into contact with the electrostatic chuck ESC. The back surface (the surface opposite to the main surface FW) of the wafer W is in contact with the electrostatic chuck ESC. The electrostatic chuck ESC adsorbs the wafer W by an electrostatic force such as a Coulomb force generated by a DC voltage from the DC power supply 22. As a result, the electrostatic chuck ESC may hold the wafer W thereon.

An edge ring ER is provided on the circumferential edge of the second plate 18b to surround the edge of the wafer W and the electrostatic chuck ESC. The edge ring ER is provided to improve the uniformity of etching. The edge ring ER is formed of a material appropriately selected according to a material of a film to be etched, and may be formed of, for example, silicon or quartz.

A refrigerant flow path 24 is provided inside the second plate 18b. The refrigerant flow path 24 constitutes a temperature control mechanism. A refrigerant is supplied to the refrigerant flow path 24 from a chiller unit (not illustrated) provided outside the processing container 12 via a pipe 26a. The refrigerant supplied to the refrigerant flow path 24 is returned to the chiller unit through a pipe 26b. In this way, the refrigerant is supplied to the refrigerant flow path 24 such that the refrigerant is circulated. By controlling the temperature of the refrigerant, the temperature of the wafer W supported by the electrostatic chuck ESC may be controlled.

A gas supply line 28 is provided in the substrate processing apparatus 10. The gas supply line 28 supplies a heat transfer gas, for example, He gas, from a heat transfer gas supply mechanism to the space between the top surface of the electrostatic chuck ESC and the back surface of the wafer W.

The substrate processing apparatus 10 is provided with a temperature controller HT that controls the temperature of the wafer W. The temperature controller HT is mounted in the electrostatic chuck ESC. A heater power supply HP is connected to the temperature controller HT. A power is supplied from the heater power supply HP to the temperature controller HT, so that the temperature of the electrostatic chuck ESC is adjusted, and the temperature of the wafer W disposed on the electrostatic chuck ESC is adjusted. In addition, the temperature controller HT may be embedded in the second plate 18b.

The substrate processing apparatus 10 includes the upper electrode 30. The upper electrode 30 is disposed above the stage PD to face the stage PD. The lower electrode LE and the upper electrode 30 are provided substantially in parallel to each other, and constitute the parallel plate electrodes. The processing space Sp is provided between the upper electrode 30 and the lower electrode LE to perform a processing on the wafer W.

The upper electrode 30 is supported on the upper portion of the processing container 12 via an insulating shielding member 32. The insulating shielding member 32 is made of an insulating material, and may include, for example, oxygen like quartz. The upper electrode 30 may include an electrode plate 34 and an electrode support 36. The electrode plate 34 faces the processing space Sp, and a plurality of gas discharge holes 34a are formed in the electrode plate 34. In an embodiment, the electrode plate 34 contains silicon. In another embodiment, the electrode plate 34 may contain silicon oxide.

The electrode support 36 detachably supports the electrode plate 34, and may be made of, for example, a conductive material such as aluminum. The electrode support 36 may have a water-cooled structure. A gas diffusion chamber 36a is provided inside the electrode support 36. A plurality of gas flow holes 36b extend downward from the gas diffusion chamber 36a to communicate with the gas discharge holes 34a.

The substrate processing apparatus 10 includes a first radio-frequency power supply 62 and a second radio-frequency power supply 64. The first radio-frequency power supply 62 generates a first radio-frequency power for generating plasma, and generates a radio-frequency power of a frequency of 27 MHz to 100 MHz, for example, 60 MHz. In addition, the first radio-frequency power supply 62 has a pulse specification which may be controlled at a frequency of 0.1 kHz to 50 kHz and a duty of 5% to 100%. The first radio-frequency power supply 62 is connected to the lower electrode LE via a matching unit 66. The matching unit 66 is a circuit for matching the output impedance of the first radio-frequency power supply 62 and the input impedance of a load side (the lower electrode LE side) with each other. In addition, the first radio-frequency power supply 62 may be connected to the upper electrode 30 via the matching unit 66.

The second radio-frequency power supply 64 generates a second radio-frequency power for drawing ions into the wafer W, that is, a radio-frequency bias power, and generates a radio-frequency bias power of a frequency in a range of from 400 kHz to 40.68 MHz, for example, a frequency of 13.56 MHz. In addition, the second radio-frequency power supply 64 has a pulse specification which may be controlled at a frequency of 0.1 kHz to 50 kHz and a duty of 5% to 100%. The second radio-frequency power supply 64 is connected to the lower electrode LE via a matching device 68. The matching unit 68 matches the output impedance of the second radio-frequency power supply 64 and the input impedance of a load side (the lower electrode LE side) with each other.

The substrate processing apparatus 10 further includes a power supply 70. The power supply 70 is connected to the upper electrode 30. The power supply 70 applies a voltage for drawing positive ions existing in the processing space Sp into the electrode plate 34, to the upper electrode 30. In an example, the power supply 70 is a DC power supply that generates a negative DC voltage. When the voltage is applied from the power supply 70 to the upper electrode 30, the positive ions existing in the processing space Sp collide with the electrode plate 34. As a result, secondary electrons and/or silicon may be emitted from the electrode plate 34.

An exhaust plate 48 is provided near the bottom of the processing container 12 and between the support 14 and the side wall of the processing container 12. The exhaust plate 48 may be configured by, for example, coating an aluminum material with ceramics such as $Y_2O_3$. An exhaust port 12e is provided below the exhaust plate 48 in the processing container 12. An exhaust device 50 is connected to the exhaust port 12e via an exhaust pipe 52. The exhaust device 50 is provided with a vacuum pump such as a turbo molecular pump, and is capable of depressurizing the space inside the processing container 12 to a desired degree of vacuum. A carry-in/out port 12g of the workpiece W is provided in the side wall of the processing container 12, and is openable/closable by a gate valve 54.

A gas source group 40 includes a plurality of gas sources. The plurality of gas sources may include sources of various gases such as a source of an organic-containing aminosilane-based gas, a source of a fluorocarbon-based gas (CxFy gas (x, y are integers of 1 to 10)), a source of a gas having oxygen atoms (e.g., oxygen gas), and a source of inert gas. As the inert gas, any gas such as nitrogen gas, Ar gas or He gas may be used.

A valve group 42 includes a plurality of valves, and a flow rate controller group 44 includes a plurality of flow rate controllers such as mass flow controllers. Each of the plurality of gas sources of the gas source group 40 is connected to a gas supply pipe 38 and a gas supply pipe 82 via a corresponding valve of the valve group 42 and a corresponding flow rate controller of the flow rate controller group 44. Accordingly, the substrate processing apparatus 10 is capable of supplying gases from one or more gas sources selected from the plurality of gas sources in the gas source group 40, into the processing container 12 at individually controlled flow rates.

A gas introduction port 36c is provided in the processing container 12. The gas introduction port 36c is provided above the wafer W disposed on the stage PD in the processing container 12. The gas introduction port 36c is connected to one end of the gas supply pipe 38. The other end of the gas supply pipe 38 is connected to the valve group 42. The gas introduction port 36c is provided in the electrode support 36. The gas supplied from the gas introduction port 36c to the processing space Sp via the gas diffusion chamber 36a is supplied to the space region above the wafer W and between the wafer W and the upper electrode 30.

A gas introduction port 52a is provided in the processing container 12. The gas introduction port 52a is provided on the lateral side of the wafer W disposed on the stage PD in the processing container 12. The gas introduction port 52a is connected to one end of the gas supply pipe 82. The other end of the gas supply pipe 82 is connected to the valve group 42. The gas introduction port 52a is provided in the side wall of the processing container 12. The gas supplied from the gas introduction port 52a to the processing space Sp is supplied to the space region above the wafer W and between the wafer W and the upper electrode 30.

In the substrate processing apparatus 10, a deposition shield 46 is detachably provided along the inner wall of the processing container 12. The deposition shield 46 is also provided on the outer periphery of the support 14. The deposition shield 46 prevents etching by-products (deposit) from adhering to the processing container 12, and may be configured by coating an aluminum material with ceramics such as $Y_2O_3$. The deposition shield 46 may be made of, for example, a material containing oxygen like quartz, other than $Y_2O_3$.

A controller Cnt is a computer provided with, for example, a processor, a storage unit, an input device, and a display device, and controls each unit of the substrate processing apparatus 10 illustrated in FIG. 23.

The controller Cnt operates according to a computer program (a program based on an input recipe) for controlling each unit of the substrate processing apparatus 10 in each step of the substrate processing method according to the embodiment, and sends out a control signal. Each unit of the substrate processing apparatus 10 is controlled by the control signal from the controller Cnt. Specifically, in the substrate processing apparatus 10 illustrated in FIG. 23, the controller Cnt is capable of controlling, for example, the selection and the flow rate of a gas to be supplied from the gas source group 40, the exhaust by the exhaust device 50, the supply of power from the first radio-frequency power supply 62 and the second radio-frequency power supply 64, the application of a voltage from the power supply 70, the supply of power from the heater power supply HP, and the flow rate and the temperature of the refrigerant from the chiller unit, by using control signals. In addition, each step of the substrate processing method disclosed herein may be performed by operating each unit of the substrate processing system 10 under the control by the controller Cnt. In the storage unit of the controller Cnt, the computer program for performing the substrate processing method according to the embodiment and various types of data used for performing the method are stored in a readable manner.

Effects of Embodiment

The substrate processing method according to the embodiment described above includes steps (a) and (b). Step (a) forms a recess on a workpiece by partially etching the workpiece. Step (b) forms a film having a thickness that differs along the depth direction of the recess, on the side wall of the recess. Step (b) includes steps (b-1) and (b-2). Step (b-1) supplies the first reactant to cause the first reactant to be adsorbed to the side wall of the recess. Step (b-2) supplies the second reactant to cause the second reactant to react with the first reactant thereby forming a film. Thus, according to the embodiment, the film thickness of the film to be formed on the pattern with the high aspect ratio may be changed along the depth direction. Thus, according to the embodiment, it is possible to form the protective film in advance at the position of the pattern where the shape abnormality may easily occur, while changing the film thickness of the protective film in the depth direction. As a result, according to the embodiment, the shape abnormality of a semiconductor pattern may be suppressed. Further, according to the embodiment, since the film having the self-controllability, for example, the ALD film is formed, the thickness of the protective film to be formed may be precisely controlled. Thus, according to the embodiment, the opening of the pattern may be suppressed from being closed. Further, according to the embodiment, by suppressing the protective film from being formed on the bottom of the pattern, the etching stop is prevented so that the etching rate may be improved. Further, according to the embodiment, by adjusting the processing conditions of steps (b-1) and (b-2), the coverage of the protective film along the depth direction of the pattern may be largely changed.

Further, in the embodiment, step (b-1) of step (b) suppresses the first reactant from being adsorbed to the entire surface of the recess, and/or step (b-2) of step (b) suppresses the first reactant and the second reactant from reacting on the entire surface of the recess. That is, the substrate processing method according to the embodiment may be terminated before the adsorption of the first reactant to the entire surface in the depth direction of the pattern is completed. Accordingly, by adjusting the processing conditions in step (b-1), the position where the protective film is to be formed may be adjusted. In addition, in the embodiment, step (b-2) may be ended before the reaction of the second reactant on the entire surface in the depth direction of the pattern is completed. Accordingly, by adjusting the processing conditions in step (b-2), the position where the protective film is to be formed may be adjusted. For example, the decrease of the etching rate may be suppressed by suppressing the protective layer from being formed on the bottom.

Further, the substrate processing method according to the embodiment may further include step (c) of etching the bottom of the recess to form a recess with a high aspect ratio, after step (b). As a result, according to the embodiment, the pattern is further processed after the protective film is formed, so that a desired shape of the pattern may be implemented.

Further, in the substrate processing method according to the embodiment, step (b) may be further performed after step (c). As a result, according to the embodiment, even when the protective film is lost due to the etching, the protective film is formed again so that a desired pattern may be formed.

Further, in the substrate processing method according to the embodiment, the workpiece may include a substrate, an etching target film formed on the substrate, and a mask formed on the etching target film. In addition, the substrate processing method may further include step (d) of forming a preliminary film on the top of the mask to reduce the opening dimension of the recess. As a result, in the substrate processing method according to the embodiment, for example, the preliminary film is formed on the top of the pattern formed on the workpiece by the chemical vapor deposition or the physical vapor deposition, so that the opening dimension at the top of the recess may be reduced. As a result, the substrate processing method according to the embodiment increases the aspect ratio of the recess. Thus, according to the embodiment, the film formation may be implemented using the sub-conformal ALD for a recess with a low aspect ratio as well.

Further, in the substrate processing method according to the embodiment, step (d) may be performed before step (b). As a result, according to the embodiment, the sub-conformal ALD may be performed after the aspect ratio of the recess is corrected.

Further, in the substrate processing method according to the embodiment, step (d) may be performed when the aspect ratio of the recess is less than 10. Further, in the substrate processing method according to the embodiment, step (d) may be performed when the ratio of the depth dimension from the upper surface of the mask to the bottom of the recess to the opening dimension at the top of the recess is less than 15. In addition, in the substrate processing method according to the embodiment, steps (a) and (b) may be repeated when the aspect ratio of the recess is 10 or more, or when the ratio of the depth dimension from the upper surface of the mask to the bottom of the recess to the opening dimension at the top of the recess is 15 or more. As a result, according to the embodiment, when the aspect ratio of the recess becomes low, the processing of stopping the sub-conformal ALD and increasing the aspect ratio may be performed. Further, the sub-conformal ALD may be effectively performed while the aspect ratio of the recess is high. In this way, according to the embodiment, the aspect ratio of the recess may be adjusted to a value suitable for the control of film formation, and then, the film formation may be performed.

Further, in the substrate processing method according to the embodiment, the processing conditions of at least one of steps (b-1) and (b-2) may be changed according to the aspect ratio of the recess, after step (a) or (c). As a result, according to the embodiment, the processing of the pattern may be continued by forming the protective film suitable for the state of the pattern after the etching.

Further, in the substrate processing method according to the embodiment, when step (b) is repeated at least "n" or more times ("n" is a natural number of 2 or more), the processing conditions may be changed in an n-th processing and an (n−1)-th processing. Accordingly, the position and/or the thickness of the film in repeated step (b) may be changed. As a result, according to the embodiment, the shape and/or the position of the film to be formed may be further finely adjusted.

Further, in the substrate processing method according to the embodiment, when step (b) is repeated at least n' or more times (n' is a natural number of 2 or more), the first reactant and the second reactant used in an n-th processing and an (n−1)-th processing may be changed. Accordingly, the position and/or the thickness of the film formed in repeated step (b) may be changed. As a result, according to the embodiment, the shape and/or the position of the film to be formed may be further finely adjusted.

Further, the substrate processing method according to the embodiment may include steps (a), (b), and (e). Step (a) forms a recess on a workpiece disposed on the stage in the processing chamber by etching the workpiece. Step (b) forms a film having a thickness that differs along the depth direction of the recess, on the side wall of the recess. Step (e) etches the workpiece while suppressing the change of the opening dimension in the upper portion of the recess by the film formed in step (b), and expands the opening dimension of the lower portion of the recess that is not covered with the film formed in step (b) in the horizontal direction.

Further, in the substrate processing method according to the embodiment, step (e) may further expand the opening dimension of the lower portion of the recess that is not covered with the film in the vertical direction, in addition to the horizontal direction. In addition, when a step of forming a recess with a high aspect ratio by etching the bottom of the recess is included after step (b), step (c) may etch the bottom of the recess by an anisotropic etching, and step (e) may expand the opening dimension of the lower portion of the recess in the horizontal direction by an isotropic etching.

Further, in the substrate processing method according to the embodiment, in step (b), each of the plurality of zones provided on the stage on which the workpiece is to be disposed and configured such that the temperatures of the plurality of zones are independently controllable may be controlled to have a different temperature according to an in-plane position of each of the plurality of zones. As a result, the thickness of the film to be formed may be changed according to the temperatures of the plurality of zones. Thus, according to the embodiment, the state of film formation may be adjusted by controlling the temperature of the stage.

Further, in the substrate processing method according to the embodiment, steps (a), (b), and (c) may be repeated at least n" times (n" is a natural number of 2 or more). Then, in step (b-2) of an (n"-1)-th processing, each of the plurality of zones provided on the stage on which the workpiece is to be disposed and configured such that the temperatures of the plurality of zones are independently controllable may be controlled to be a first temperature distribution. Then, a first film having a first thickness distribution in the depth direction may be formed. In addition, in step (b-2) of an n"-th processing, each of the plurality of zones may be controlled to be a second temperature distribution. Then, a second film having a second thickness distribution in the depth direction may be formed. As a result, according to the embodiment, the state of film formation may be adjusted by controlling the temperature of the stage.

Further, in the substrate processing method according to the embodiment, the pressure of the processing chamber in step (b-1) may be set to a smaller value than that of a pressure at which the adsorption of the first reactant to the entire surface of the recess in the depth direction of the recess is completed, when the other processing conditions are the same. In addition, the processing time in step (b-1) may be set to be shorter than a processing time for which the adsorption of the first reactant to the entire surface of the recess in the depth direction of the recess is completed, when the other processing conditions are the same. In addition, the dilution degree of the first reactant in step (b-1) may be set to a higher value than that of a dilution degree at which the adsorption of the first reactant to the entire surface of the recess in the depth direction of the recess is completed, when the other processing conditions are the same. In addition, the temperature of the stage of the workpiece in step (b-1) may be set to be lower than a temperature at which the adsorption of the first reactant to the entire surface of the recess in the depth direction of the recess is completed, when the other processing conditions are the same. In addition, when plasma is generated in step (b-1), the absolute value of the radio-frequency (RF) power applied for generating plasma may be set to be smaller than an absolute value at which the reaction of the second reactant on the entire surface of the recess in the depth direction of the recess in the depth direction of the recess is completed, when the other processing conditions are the same. In this way, the adsorption of the component contained in the first reactant to the workpiece may be implemented, while changing the coverage along the depth direction of the recess by adjusting the processing conditions in step (b-1).

Further, in the substrate processing method according to the embodiment, the pressure of the processing chamber in step (b-2) may be set to a smaller value than that of a pressure at which the reaction of the second reactant on the entire surface of the recess in the depth direction of the recess is completed, when the other processing conditions are the same. In addition, the processing time in step (b-2) may be set to be shorter than a processing time for which the reaction of the second reactant on the entire surface of the recess in the depth direction of the recess is completed, when the other processing conditions are the same. In addition, the dilution degree of the second reactant in step (b-2) may be set to a higher value than that of a dilution degree at which the reaction of the second reactant on the entire surface of the recess in the depth direction of the recess is completed, when the other processing conditions are the same. In addition, the temperature of the stage of the workpiece in step (b-2) may be set to be lower than a temperature at which the reaction of the second reactant on the entire surface of the recess in the depth direction of the recess is completed, when the other processing conditions are the same. In addition, when plasma is generated in step (b-2), the absolute value of the radio-frequency (RF) power applied for generating plasma may be set to be smaller than an absolute value at which the reaction of the second reactant on the entire surface of the recess in the depth direction of the recess is completed, when the other processing conditions are the same. In this way, the reaction of the component contained in the second reactant on the surface of the workpiece may be implemented, while changing the coverage along the depth direction of the recess by adjusting the processing conditions in step (b-2).

Further, the substrate processing method according to the embodiment described above may further include, step (f) of forming an inhibitor that inhibits the adsorption of the first reactant on the side wall of the recess, before step (b-1). As a result, according to the embodiment, the protective film may be formed at an arbitrary position.

Further, the substrate processing method according to the embodiment described above may further include step (g) of performing a coating for covering by-product adhering to the inner wall of the processing chamber, after step (a). As a result, according to the embodiment, the change of the condition and state in the processing chamber may be prevented. Thus, according to the embodiment, the state of the film to be formed may be stabilized.

Further, in the substrate processing apparatus according to the embodiment, step (b) may include steps (b-3), (b-4), and (b-5). Step (b-3) measures a parameter that indicates a state of a formed film. Step (b-4) determines whether the film is in a preset state, based on the measured value. Step (b-5) adjusts the processing conditions based on the measured value, and then, repeats steps (b-1) and (b-2), when it is determined that the film is not in the preset state.

In addition, the substrate processing apparatus according to the embodiment includes one or more processing chambers of which at least one processing chamber is configured to perform an etching and at least one processing chamber is configured to form a film, and a controller. Each processing chamber includes a gas supply that supplies a processing gas into the processing chamber. The controller causes each unit of the substrate processing apparatus to perform the substrate processing method. The substrate processing method includes steps (a) and (b). Step (a) forms a recess on a workpiece by partially etching the workpiece. Step (b) forms a film having a thickness that differs along a depth direction of the recess, on the side wall of the recess. Step (b) includes steps (b-1) and (b-2). Step (b-1) supplies the first reactant into the processing chamber configured to form a film, and causes the first reactant to be adsorbed to the side wall of the recess. Step (b-2) supplies the second reactant into the processing chamber configured to form a film, and causes the second reactant to react with the first reactant thereby forming a film. Thus, according to the embodiment, the film thickness of the film to be formed on the pattern with the high aspect ratio may be changed along the depth direction. As a result, according to the embodiment, it is possible to form the protective film in advance at the position of the pattern where the shape abnormality may easily occur, while changing the film thickness in the depth direction. Thus, according to the embodiment, the shape abnormality of a semiconductor pattern may be suppressed. In addition, according to the embodiment, since the film having the self-controllability, for example, the ALD film is formed, the film thickness of the protective film to be formed may be precisely controlled. As a result, according to the embodiment, the closing of the opening of the pattern may be suppressed. In addition, according to the embodiment, by suppressing the protective film from being formed on the bottom of the pattern, the etching stop is prevented so that the etching rate may be improved. Further, according to the embodiment, the coverage of the protective film along the depth direction of the pattern may be largely changed by adjusting the processing conditions of steps (b-1) and (b-2).

In addition, in the substrate processing apparatus according to the embodiment, the processing chamber configured to perform an etching may be the same as the processing chamber configured to form a film, and steps (a) and (b) may be performed in the same processing chamber.

In addition, in the substrate processing apparatus according to the embodiment, the processing chamber configured to perform an etching may be different from the processing chamber configured to form a film. Then, the controller may cause each unit of the substrate processing apparatus to perform the substrate processing method that further includes (h) transferring the substrate between the processing chamber configured to perform an etching and the processing chamber configured to form a film.

According to the present disclosure, it is possible to suppress the shape abnormality of a semiconductor pattern.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of processing a substrate comprising:
   (a) forming a recess on a substrate by partially etching the substrate;
   (b) forming a film on a side wall of the recess such that the film has a thickness that differs along a depth direction of the recess, on a side wall of the recess;
   (c) etching the substrate while suppressing a change of an opening dimension of an upper portion of the recess by the film formed in (b), thereby forming the recess having a tapered shape; and
   (d) expanding an opening dimension of a lower portion of the recess that is not covered with the film formed in (b) in a horizontal direction.

2. The method of claim 1, wherein (b) includes:
   (b-1) supplying a first reactant, and allowing the first reactant to adsorb onto the side wall of the recess; and
   (b-2) supplying a second reactant, wherein the first and second reactants react with each other to form the film.

3. The method of claim 2, wherein in (b),
   (b-1) suppresses the first reactant from adsorbing onto an entire surface of the recess, and/or
   (b-2) suppresses the first reactant and the second reactant from reacting on the entire surface of the recess, and the method further comprises:
   (e) etching a bottom of the recess to form a recess with a high aspect ratio, after (b).

4. The method of claim 3, wherein (b) is further performed after (e).

5. The method of claim 4, wherein (a) includes:
   (a-1) providing a substrate having a recess; and
   (a-2) forming a first film on a top of the recess by chemical vapor deposition or physical vapor deposition, and wherein the forming of the first film is after a determination that an aspect ratio of the recess is not equal to or greater than a predetermined value.

6. The method of claim 5, wherein the substrate includes an etching target film and a mask formed on the etching target film, and
   in (a-2):
   the first film is formed on a top of the mask to reduce an opening dimension of the recess, wherein (a-2) is performed prior to (b).

7. The method of claim 6, wherein (a-2) is performed when the aspect ratio of the recess is less than 10.

8. The method of claim 6, wherein (a-2) is performed when a ratio of a depth dimension from an upper surface of the mask to the bottom of the recess with respect to the opening dimension of the recess at a top of the recess is less than 15.

9. The method of claim 6, wherein (a) and (b) are repeated when the aspect ratio of the recess is 10 or more, or when the ratio of the depth dimension from the upper surface of the mask to the bottom of the recess with respect to the opening dimension of the recess at the top of the recess is 15 or more.

10. The method of claim 5,
    wherein (a-1) includes:
    (a-11) providing the substrate including an etching target film and a mask on the etching target film, the mask having at least one opening; and
    (a-12) forming the recess on the etching target film by partially etching the etching target film with a first plasma generated from a first process gas through the mask, and
    (a-2) includes:
    after (a-12), forming the first film on a top of the mask with a second process gas different from the first process gas, and
    (b) is performed after (a-2).

11. The method of claim 3, wherein after (a) or (e), processing conditions of at least one of (b-1) and (b-2) are changed according to the aspect ratio of the recess.

12. The method of claim 2, wherein when (b) is repeated n or more times (n is a natural number of 2 or more), a position and/or a thickness of the film formed in repeated (b) are changed by changing processing conditions in an n-th processing and an (n−1)-th processing.

13. The method of claim 12, wherein when (b) is repeated n' or more times (n' is a natural number of 2 or more), a position and/or a thickness of the film formed in repeated (b) are changed by changing the first reactant and the second reactant used in an n'-th processing and an (n'−1)-th processing.

14. The method of claim 2,
    wherein in (b), the substrate is disposed on a stage provided with a plurality of zones and configured such that temperatures of the plurality of zones are independently controllable, and
    each of the plurality of zones is controlled to have a different temperature according to an in-plane position of the corresponding zone, thereby changing the thickness of the film to be formed according to the temperatures of the plurality of zones.

15. The method of claim 2,
    wherein the substrate is disposed on a stage provided with a plurality of zones and configured such that temperatures of the plurality of zones are independently controllable,
    (a) and (b) are repeated at least n" times (n" is a natural number of 2 or more),
    in (b-2) of an (n"-1)-th processing, each of the plurality of zones is controlled to be a first temperature distribution, thereby forming a first film having a first film thickness distribution in a depth direction, and in (b-2) of an n"-th processing, each of the plurality of zones is controlled to be a second temperature distribution, thereby forming a second film having a second film thickness distribution in the depth direction.

16. The method of claim 2, wherein processing conditions in (b-1) satisfy at least one of following conditions (1) to (5):

(1) a pressure of a processing chamber is set to a smaller value than that of a pressure at which an adsorption of the first reactant to an entire surface of the recess in a depth direction of the recess is completed, (2) a processing time is set to be shorter than a processing time for which the adsorption of the first reactant to the entire surface of the recess in the depth direction of the recess is completed, (3) a dilution degree of the first reactant is set to a higher value than that of a dilution degree at which the adsorption of the first reactant to the entire surface of the recess in the depth direction of the recess is completed, (4) a temperature of a stage disposed the substrate is set to be lower than a temperature at which the adsorption of the first reactant to the entire surface of the recess in the depth direction of the recess is completed, and (5) a plasma is generated in (b-1), and an absolute value of a radio-frequency (RF) power applied for generating plasma is set to be smaller than an absolute value at which the adsorption of the first reactant to the entire surface of the recess in the depth direction of the recess is completed.

17. The method of claim 2, wherein processing conditions in (b-2) satisfy at least one of following conditions (1) to (5):

(1) a pressure of the processing chamber is set to a smaller value than that of a pressure at which a reaction of the second reactant on an entire surface of the recess in a depth direction of the recess is completed, (2) a processing time is set to be shorter than a processing time for which the reaction of the second reactant on the entire surface of the recess in the depth direction of the recess is completed, (3) a dilution degree of the second reactant is set to a higher value than that of a dilution degree at which the reaction of the second reactant on the entire surface of the recess in the depth direction of the recess is completed, (4) a temperature of a stage disposed the substrate is set to be lower than a temperature at which the reaction of the second reactant to the entire surface of the recess in the depth direction of the recess is completed, and (5) a plasma is generated in (b-2), and an absolute value of a radio-frequency (RF) power applied for generating plasma is set to be smaller than an absolute value at which the reaction of the second reactant on the entire surface of the recess in the depth direction of the recess is completed.

18. The method of claim 2, further comprising:
(f) forming an inhibitor that inhibits the adsorption of the first reactant, on the side wall of the recess before (b-1).

19. The method of claim 2, further comprising:
(g) performing a coating process for covering by-products adhering to an inner wall of a processing chamber, after (a).

20. The method of claim 2, wherein (b) is performed after a determination that the aspect ratio of the recess is greater than or equal to the predetermined value.

* * * * *